United States Patent
Suzuki et al.

(10) Patent No.: US 8,396,164 B2
(45) Date of Patent: Mar. 12, 2013

(54) RECEIVING DEVICE INCLUDING IMPEDANCE CONTROL CIRCUIT AND SEMICONDUCTOR DEVICE INCLUDING IMPEDANCE CONTROL CIRCUIT

(75) Inventors: Youichirou Suzuki, Nishio (JP); Noboru Maeda, Chiryu (JP); Takashi Nakano, Nukata-gun (JP); Kazuyoshi Nagase, Kitanagoya (JP); Koji Kondo, Tokoname (JP); Shigeki Takahashi, Okazaki (JP); Yoshihiko Ozeki, Okazaki (JP)

(73) Assignees: DENSO CORPORATION, Kariya (JP); Nippon Soken, Inc., Nishio (JP)

(*) Notice: Subject to any disclaimer, the term of this patent is extended or adjusted under 35 U.S.C. 154(b) by 1072 days.

(21) Appl. No.: 12/320,802

(22) Filed: Feb. 5, 2009

(65) Prior Publication Data
US 2010/0177829 A1 Jul. 15, 2010

(30) Foreign Application Priority Data

Mar. 17, 2008 (JP) .................................. 2008-67710
Apr. 2, 2008 (JP) .................................. 2008-96464

(51) Int. Cl.
*H03K 9/00* (2006.01)
*H04L 27/00* (2006.01)
(52) U.S. Cl. .......... 375/316; 375/244; 375/257; 333/32; 322/75
(58) Field of Classification Search .................. 375/244, 375/257, 316; 333/32; 322/75–80
See application file for complete search history.

(56) References Cited

U.S. PATENT DOCUMENTS

| 4,573,168 | A  | * | 2/1986  | Henze et al. ................... 375/257 |
| 5,331,213 | A  |   | 7/1994  | Ohmori et al. |
| 5,398,261 | A  | * | 3/1995  | Marbot ......................... 375/257 |
| 5,523,703 | A  |   | 6/1996  | Yamamoto et al. |
| 6,218,854 | B1 |   | 4/2001  | Ko |
| 6,326,803 | B1 |   | 12/2001 | Takeda |
| 6,487,250 | B1 |   | 11/2002 | Kato et al. |
| 6,653,181 | B2 |   | 11/2003 | Hergenrother et al. |
| 2001/0013075 | A1 | | 8/2001  | Otsuka et al. |

FOREIGN PATENT DOCUMENTS

| JP | A-02-122730 | 5/1990 |
| JP | A-6-152610  | 5/1994 |

(Continued)

OTHER PUBLICATIONS

Office Action mailed Feb. 2, 2010 from Japan Patent Office in corresponding JP Application No. 2008-067710 (and English translation).

(Continued)

*Primary Examiner* — Curtis Odom
(74) *Attorney, Agent, or Firm* — Posz Law Group, PLC

(57) ABSTRACT

A receiving device includes a receiving circuit and an impedance control circuit. The receiving circuit receives a signal transmitted through a communication line. The impedance control circuit is coupled with the receiving circuit and has a detecting part. The detecting part detects a physical value of the signal and the physical value includes at least one of a voltage, an electric current, and an electric power. The impedance control circuit changes an input impedance based on the detected value so that a ringing of the signal is reduced.

1 Claim, 26 Drawing Sheets

FOREIGN PATENT DOCUMENTS

| | | |
|---|---|---|
| JP | A-08-162930 | 6/1996 |
| JP | A-8-298526 | 11/1996 |
| JP | A-10-126316 | 5/1998 |
| JP | A-11-274987 | 10/1999 |
| JP | A-2000-59443 | 2/2000 |
| JP | A-2006-67543 | 3/2006 |
| JP | A-2007-318734 | 12/2007 |

OTHER PUBLICATIONS

Office Action dated May 17, 2010 issued from the German Patent Office in the corresponding German patent application No. 10 2009 008 182.8-35 (with English translation).

* cited by examiner

RECEIVING DEVICE INCLUDING IMPEDANCE CONTROL CIRCUIT AND SEMICONDUCTOR DEVICE INCLUDING IMPEDANCE CONTROL CIRCUIT

CROSS REFERENCE TO RELATED APPLICATIONS

The present application is based on and claims priority to Japanese Patent Applications No. 2008-67710 filed on Mar. 17, 2008 and No. 2008-96464 filed on Apr. 2, 2008, the contents of which are incorporated in their entirety herein by reference.

BACKGROUND OF THE INVENTION

1. Field of the Invention

The present invention relates to a receiving device including an impedance control circuit and a semiconductor device including an impedance control circuit.

2. Description of the Related Art

In a case where a digital signal is transmitted through a communication line, a part of a signal energy may reflect on a receiving side at a time when signal level changes. Thereby, a ringing, that is, a distortion of a waveform such as an overshooting and an undershooting may occur. Various technologies are suggested for restricting a ringing. For example, U.S. Pat. No. 6,326,803 (corresponding to JP-A-2001-127805) discloses a termination circuit for a communication line. In a case where a voltage of a signal transits between a low level and a high level in the termination circuit of the communication line, an impedance of a terminator is temporarily reduced during a delay time provided by a delay circuit.

U.S. Pat. No. 6,487,250 (corresponding to JP-A-2000-353945) discloses a signal output system in which an output impedance is continuously changed at a time when a level of an output signal changes. U.S. Pat. No. 6,218,854 (corresponding to JP-A-2000-59444) discloses an integrated circuit device in which an overshooting and an undershooting are attenuated by an attenuation circuit and an output terminal of the attenuation circuit is charged and discharged to a power supply voltage and a ground voltage by a charge/discharge circuit.

However, in an actual communication network, a waveform changes on a receiving side in various ways. Thus, even if an impedance is changed for a predetermined time as described in U.S. Pat. No. 6,326,803 or an output impedance is changed on a transmitting side as described in U.S. Pat. No. 6,487,250, a ringing on the receiving side may not be restricted sufficiently. When an overshooting or an undershooting occurs in the integrated circuit device disclosed in U.S. Pat. No. 6,218,854, the attenuation circuit and the charge/discharge circuit uniformly handle the overshooting or the undershooting. Thus, the ringing on the receiving side may not be restricted sufficiently.

JP-A-2007-318734 and JP-A-2006-67543 respectively disclose a semiconductor device coupled with a differential communication line.

FIG. 32 is a schematic diagram illustrating a differential communication network disclosed in JP-A-2007-318734. The differential communication network is provided in a vehicle. The differential communication network includes a plurality of nodes 210 and a differential communication line 212 for coupling the nodes 210 with each other.

Each of the nodes 210 is a sensor for detecting a state of the vehicle or an electronic control unit (ECU) for controlling an actuator based on information from a sensor. The differential communication line 212 is provided for transmitting control communication signals between the nodes 210. The differential communication line 212 is formed of a pair of twisted phase conductors. A differential signal is transmitted through the pair of phase conductors. An electric current that flows in one of the pair of phase conductors has a phase opposite to an electric current that flows in the other one of the pair of phase conductors. Thus, the differential signal creates a potential difference.

Each of the nodes 210 includes a communication circuit. Each of the nodes 210 converts transmitting data and receiving data at the communication circuit in accordance with a communication protocol of the differential communication line and communicates with each other through the differential communication line 212.

The differential communication line 212 extends in a body 214 of the vehicle from front to rear and from left to right. On the differential communication line 212, a plurality of hubs 216 and a through connector 218 are disposed. Each of the hubs 216 includes two bus bars for dividing the differential communication line 212. The through connector 218 is provided so that the node 210 can be freely connected and disconnected with the differential communication line 212 through the through connector 218.

On the differential communication line 212, there is a portion where a plurality of harnesses 220 is arranged in parallel. The harnesses 220 include a communication line used for an in-vehicle system and a power supply line for driving an actuator. In the harnesses 220, a differential harness and a single-end harness that uses the body 214 as a return channel are mixed. A portion where the differential communication line 212 and the harnesses 220 are arranged in parallel is bundled, for example, with a tape and becomes a harness bundle 222. The harness bundle 222 is located at a lower portion of a door that couples a front portion and a rear portion of the vehicle.

In the differential communication network, if a surge such as electro static discharge (ESD) is applied to the pair of phase conductors, a semiconductor device in the nodes 210 may be damaged. In addition, if an overshooting occurs in the semiconductor device at a rising edge or a falling edge of an input signal from the pair of phase conductors, the semiconductor device may malfunction.

SUMMARY OF THE INVENTION

In view of the foregoing problems, it is an object of the present invention to provide a receiving device including an impedance control circuit. Another object of the present invention is to provide a semiconductor device including an impedance control circuit.

According to an aspect of the present invention, a receiving device includes a receiving circuit and an impedance control circuit. The receiving circuit is configured to receive a signal transmitted through a communication line. The impedance control circuit is coupled with the receiving circuit and has a detecting part. The detecting part is configured to detect a physical value of the signal and the physical value includes at least one of a voltage, an electric current, and an electric power. The impedance control circuit is configured to change an input impedance based on the detected value so that a ringing of the signal is reduced.

The present receiving device changes the input impedance in accordance with at least one of the voltage, the electric current, and the electric power of the signal received through the communication line. Thus, the present receiving device can restrict a ringing of the signal effectively.

According to another aspect of the present invention, a semiconductor device includes an impedance control circuit and a breakdown element. The impedance control circuit is coupled between a pair of phase conductors of a communication line and the impedance control circuit is configured to reduce an impedance of the impedance control circuit when a potential difference between the pair of phase conductors is greater than a predetermined first voltage. The breakdown element is coupled between one of the pair of phase conductors and one of a grounding line and a power supply line. The breakdown element is configured to break down when a surge having a voltage greater than a predetermined second voltage is applied to the one of the pair of phase conductors so that the surge flows to the one of the grounding line and the power supply line. The breakdown element includes a semiconductor substrate and a first contact region, a second contact region, and a third contact region that are disposed in the semiconductor substrate. The first contact region is coupled with the one of the pair of phase conductors. The second contact region is coupled with the one of the grounding line and the power supply line. The third contact region is coupled with the impedance control circuit. The first contact region and the third contact region are disposed on opposite sides of the second contact region.

The present semiconductor device can restrict a flow of a surge current to the impedance control circuit. In addition, the present semiconductor device can restrict a ringing of a signal received through the pair of phase conductors.

BRIEF DESCRIPTION OF THE DRAWINGS

Additional objects and advantages of the present invention will be more readily apparent from the following detailed description of preferred embodiments when taken together with the accompanying drawings. In the drawings.

DETAILED DESCRIPTION OF THE PREFERRED EMBODIMENTS (First Embodiment)

Figure 1:
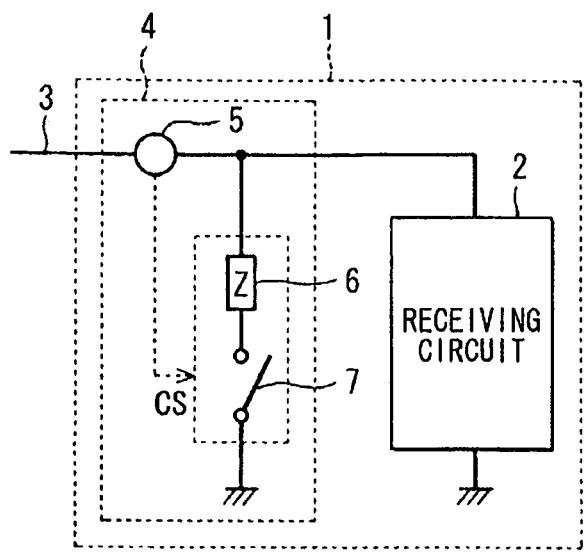
FIG. 1 is a circuit diagram illustrating a receiving device according to a first embodiment of the present invention.
Figure 2:
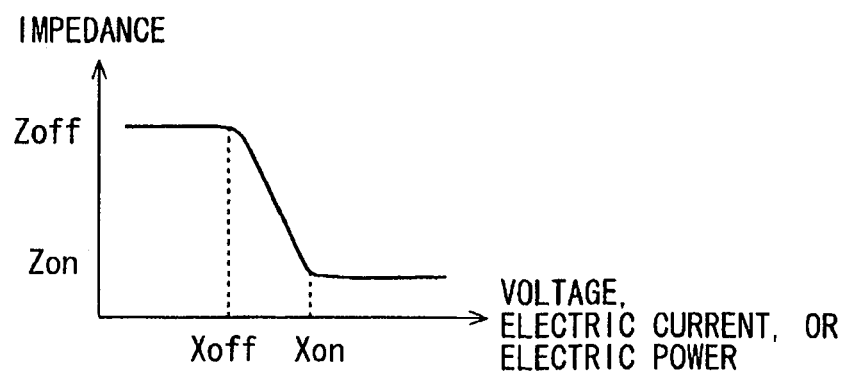
FIG. 2 is a graph illustrating a relationship between a physical value of a signal detected by a detecting part and an impedance of an impedance control circuit.

A receiving device 1 according to a first embodiment of the present invention will be described with reference to FIG. 1 and FIG. 2. The receiving device 1 includes a receiving circuit 2, a communication line 3, and an impedance control circuit 4 disposed between the communication line 3 and the receiving circuit 2. The impedance control circuit 4 includes a detecting part 5 inserted in the communication line 3, an impedance element 6 and a switch circuit 7 coupled between the communication line 3 and a ground. The detecting part 5, the impedance element 6, and the switch circuit 7 are coupled in series. The switch circuit 7 is normally open.

The detecting part 5 is configured to detect a physical value of a signal received through the communication line 3 and the physical value includes at least one of a voltage, an electric current, and an electric power. When the detected value is greater than a threshold value, the detecting part 5 outputs a control signal CS to the switch circuit 7 so that the switch circuit 7 is closed. An impedance Zoff of the impedance control circuit 4 in a case where the switch circuit 7 is open is much greater than an impedance ZR of the receiving circuit 2 (i.e., Zoff>>ZR). An impedance of the impedance element 6 is set so that a synthetic impedance Zon//ZR of the impedance ZR of the receiving circuit 2 and an impedance Zon of the impedance control circuit 4 in a case where the switch circuit 7 is closed is substantially equal to a characteristic impedance Z0 of the communication line 3. In the present application, A//B means a synthetic impedance of an impedance A and an impedance B.

An off-state threshold value Xoff and an on-state threshold value Xon of a detecting physical value, that is, at least one of the voltage, the electric current and the electric power are predetermined. As illustrated in FIG. 2, when the detected value changes from the off-state threshold value Xoff to the on-state threshold value Xon, the impedance of the impedance control circuit 4 continuously changes from the impedance Zoff to the impedance Zon.

When the impedance of the impedance control circuit 4 becomes the impedance Zon, the synthetic impedance of the impedance of the receiving circuit 2 and an impedance of the impedance control circuit 4, that is, an input impedance of the receiving circuit 2 viewed from the communication line 3 changes from Zoff//ZR≅ZR to Zon//ZR≅Z0. The input impedance of the receiving circuit 2 is changed during a transitional period when an energy of the receiving signal changes and the input impedance is matched with the characteristic impedance Z0 of the communication line 3. Thereby, an excess energy can be consumed in the impedance control circuit 4 and a ringing of the receiving signal can be restricted.

The impedance control circuit 4 detects at least one of the voltage, the electric current and the electric power of the signal received at the receiving circuit 2 by using the detecting part 5 and changes the input impedance in accordance with a change in the detected value so that a ringing of the received signal is restricted. Thus, the impedance control circuit 4 restricts the ringing in accordance with an actual changing state of the received signal. Thus, the ringing of the received signal can be restricted effectively. In addition, because the impedance control circuit 4 changes the input impedance of the receiving circuit 2 so as to match the characteristic impedance Z0 of the communication line 3, the impedance control circuit 4 can restrict the ringing of the receiving signal more effectively.

(Second Embodiment)

Figure 3A:
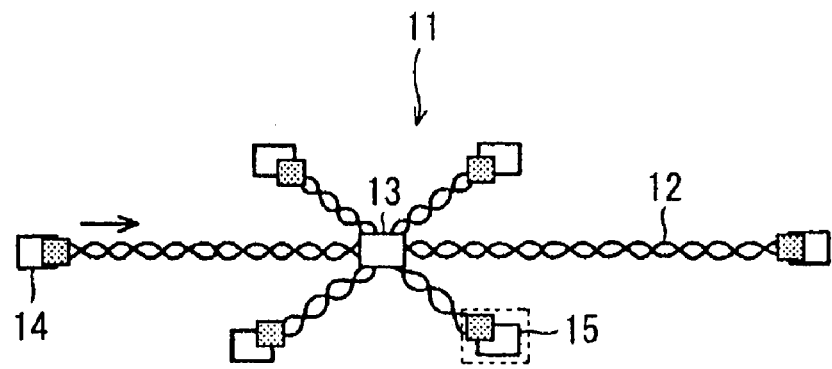
FIG. 3A is a diagram illustrating a communication network including a receiving device according to a second embodiment of the present invention and FIG. 3B is a circuit diagram illustrating the receiving device according to the second embodiment.
Figure 3B:
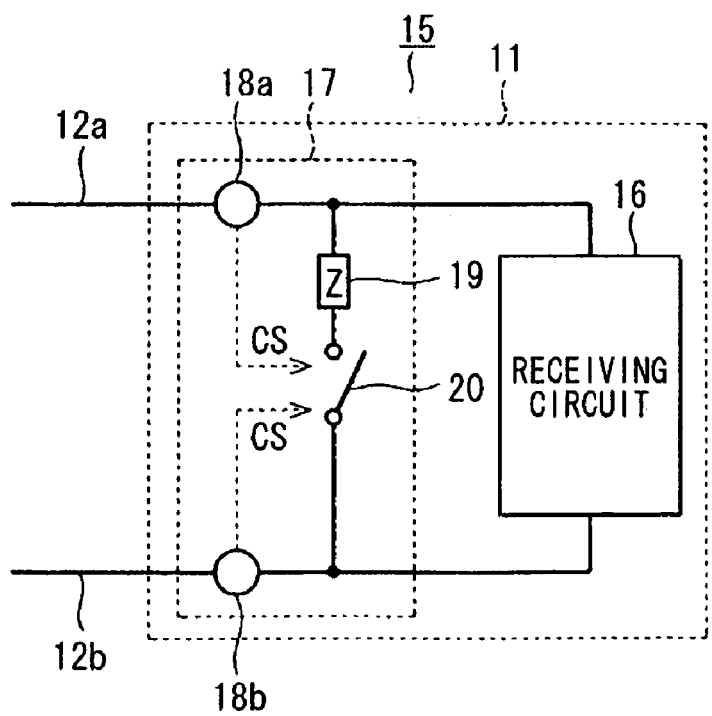

A receiving device 15 according to a second embodiment of the present invention will be described with reference to FIG. 3A and FIG. 3B. The receiving device 15 may be provided in a communication network 11 in which a differential signal is transmitted through a communication line 12. The communication line 12 is formed of a pair of phase conductors, that is, a bus line plus (BP) and a bus line minus (BM). For example, a signal line 12a is the phase conductor BP and the signal line 12b is the phase conductor BM. In the communication network 11, a plurality of communication nodes are coupled with each other through the communication line 12. In the communication line 12, a hub 13 is inserted.

The receiving device 15 is one of the communication nodes. The receiving device 15 is configured to receive a differential signal from a transmitting device 14 through the communication line 12. The receiving device 15 includes a receiving circuit 16 and an impedance control circuit 17 coupled between the signal lines 12a and 12b. The impedance control circuit 17 includes detecting parts 18a and 18b, an impedance element 19, and a switch circuit 20. The detecting part 18a is inserted in the signal line 12a and the detecting part 18b is inserted in the signal line 12b. The impedance element 19 and the switch circuit 20 are coupled in series between the signal lines 12a and 12b. The switch circuit 20 is normally open.

Each of the detecting parts 18a and 18b detects at least one of a voltage, an electric current, and an electric power of the differential signal transmitted through corresponding one of the signal lines 12a and 12b. For example, when the detected value detected by one of the detecting parts 18a and 18b is greater than a threshold value, the one of the detecting parts 18a and 18b outputs a control signal CS to the switch circuit 20 so that the switch circuit 20 is closed. An impedance of the impedance element 19 is set so that a synthetic impedance Zon//ZR of the impedance ZR of the receiving circuit 16 and an impedance Zon of the impedance control circuit 17 in a case where the switch circuit 20 is closed is substantially equal to a characteristic impedance Z0 of the communication line 12.

In the present embodiment, a differential signal is transmitted through the pair of signal lines 12a and 12b and the detecting parts 18a and 18b are inserted in the respective signal lines 12a and 12b. Thus, the receiving device 15 can restrict a ringing of the differential signal at a rising edge and a falling edge of the differential signal. The first and second embodiments describe schematic configurations of the respective semiconductor devices and do not always correspond to actual configurations.

(Third Embodiment)

A receiving device 15 according to a third embodiment of the present invention will be described with reference to FIG. 4A-FIG. 5B. The receiving device 15 can be provided in a communication network 11. In the communication network 11 illustrated in FIG. 4A, a length of the communication line 12 between the transmitting device 14 and the hub 13 is about 4 m and a length of the communication line 12 between the hub 13 and the receiving device 15 is about 2 m. The transmitting device 14 is a trunk node having a matching circuit. The receiving device 15 is a branch node without a matching circuit. The communication network 11 can be used for FlexRay (registered trademark) that is an example of in-vehicle local area network (in-vehicle LAN).

Between the pair of signal lines 12a and 12b, an impedance control circuit 21a, an impedance control circuit 21b, and a receiving circuit 16 are coupled in parallel. The impedance control circuit 21a includes an N channel metal-oxide-semiconductor field-effect transistor (N channel MOSFET) 22a. A gate of the MOSFET 22a is coupled with the signal line 12a. A drain of the MOSFET 22a is coupled with the signal line 12a through a resistance element 23a. A source of the MOSFET 22a is coupled with the signal line 12b. A back-gate of the MOSFET 22a is coupled with the signal line 12b through a resistance element 24a. The resistance element 23a may be coupled to a source side of the MOSFET 22a.

The impedance control circuit 21b includes an N channel MOSFET 22b. A gate of the MOSFET 22b is coupled with the signal line 12b. A drain of the MOSFET is coupled with the signal line 12b through a resistance element 23b. A source of the MOSFET 22b is coupled with the signal line 12a and a back-gate of the MOSFET is coupled with the signal line 12a through a resistance element 24b. The MOSFET 22a and 22b can function as semiconductor switching elements. The resistance elements 23a and 23b can function as impedance element for controlling an input impedance. The resistance elements 24a and 24b can function as impedance element for controlling a threshold value of corresponding MOSFETs 22a and 22b. The threshold values of the MOSFETs 22a and 22b are controlled so that the MOSFETs 22a and 22b are activated when a potential difference between the signal lines 12a and 12b is greater than about 0.7 V or less than about −0.7 V, for example. In the communication network 11, the potential difference between the signal lines 12a and 12b is 0 V in an idle state where a differential signal is not transmitted. Thus, the MOSFETs 22a and 22b can function as detecting parts.

In the receiving device 15 according to the present embodiment, the impedance control circuit 21a can restrict a ringing at a rising edge of a waveform of the differential signal and the impedance control circuit 21b can restrict a ringing at a falling edge of the waveform of the differential signal. In the impedance control circuit 21a, when a voltage of the signal line 12a with respect to the signal line 12b is greater than about 0.7 V, that is, when the potential difference between the signal lines 12a and 12b is greater than about 0.7 V, the MOSFET 22a is activated and the resistance element 23a is coupled between the signal lines 12a and 12b. Thereby, the input impedance of the receiving circuit 16 is reduced. In the impedance control circuit 21b, when a voltage of the signal line 12b with respect to the signal line 12a is greater than about 0.7 V, that is, when the potential difference between the signal lines 12a and 12b is less than about −0.7 V, the MOSFET 22b is activated and the resistance element 23b is coupled between the signal lines 12a and 12b. Thereby, the input impedance of the receiving circuit 16 is reduced.

Figure 4A:
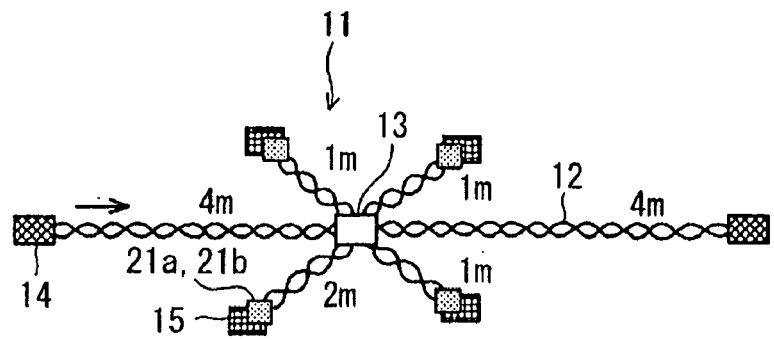
FIG. 4A is a diagram illustrating a communication network including a receiving device according to a third embodiment of the present invention.
Figure 4B:
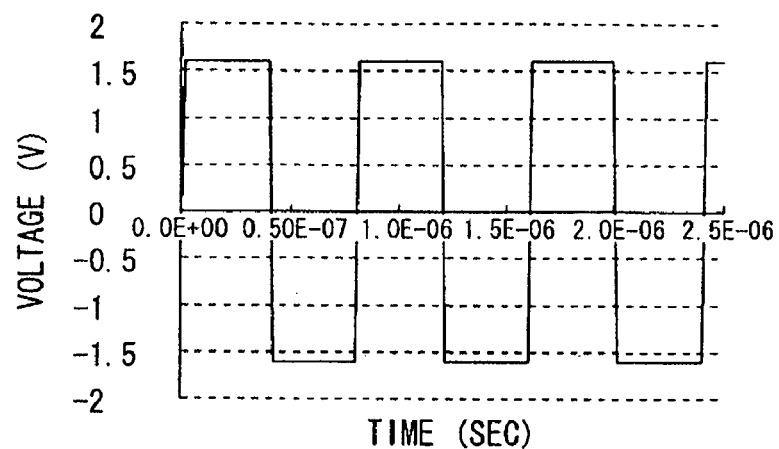
FIG. 4B is a graph illustrating a waveform of a signal transmitted from a transmitting device.
Figure 4C:
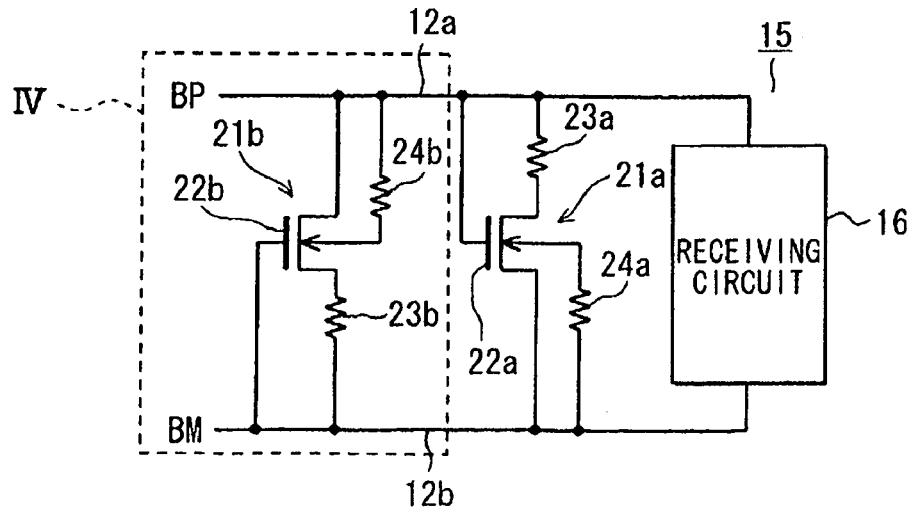
FIG. 4C is a circuit diagram illustrating the receiving device according to the third embodiment.
Figure 5A:
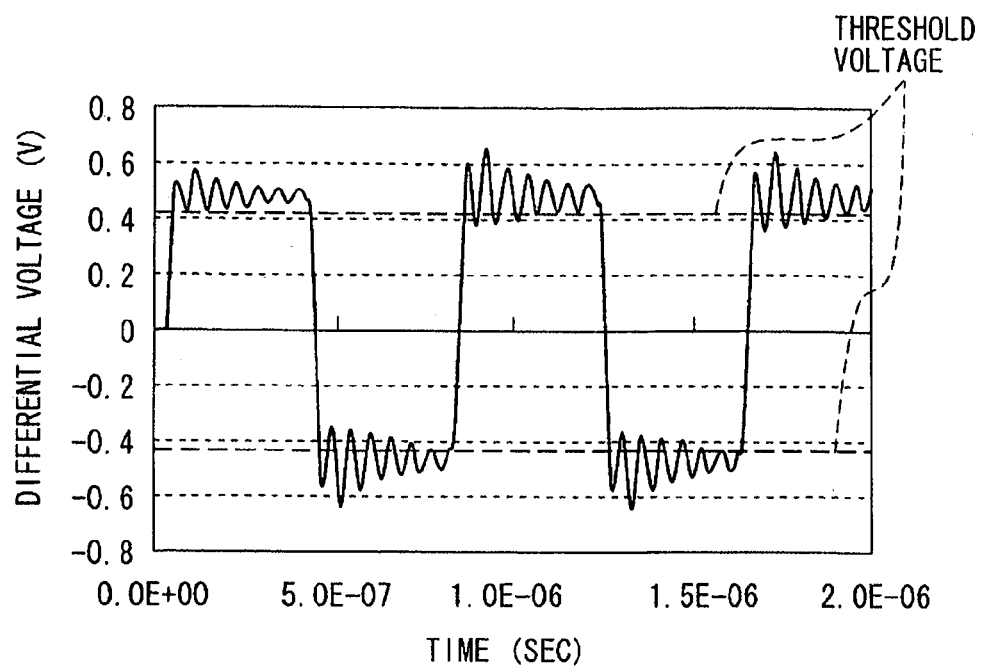
FIG. 5A is a graph illustrating a simulation result in a case where an impedance control circuit is not provided and FIG. 5B is a graph illustrating a simulation result in a case where an impedance control circuit is provided.
Figure 5B:
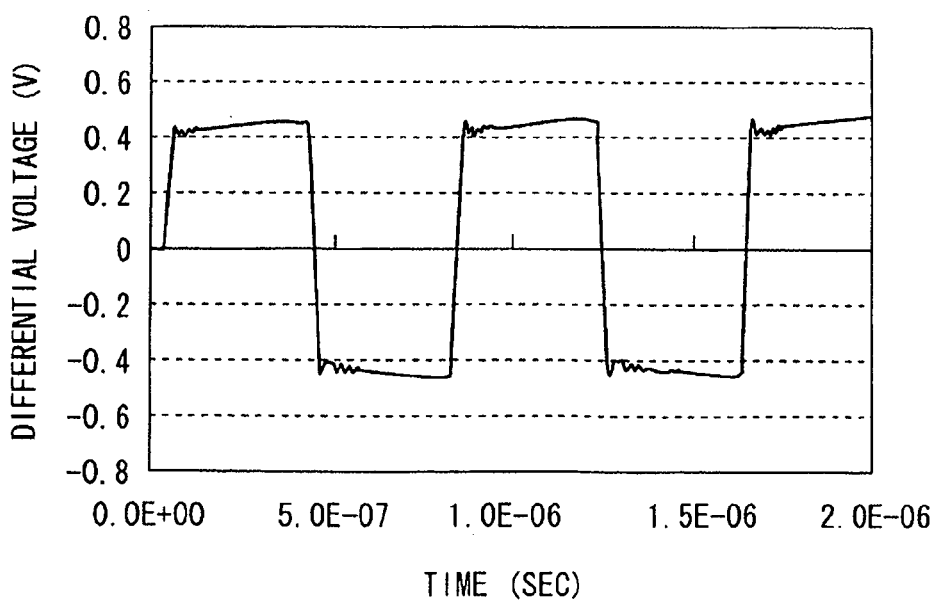

In order to verify effects of the impedance control circuits 21a and 21b, a simulation can be performed with HSPICE (registered trademark of Synopsys), as was demonstrated by the inventors, in which a transmission speed is set to be about 2.5 Mbps (bit per second) and the communication line 12 is assumed to be lossless. The transmitting device 14 transmits a differential signal that has a voltage changing in a rectangular waveform as illustrated in FIG. 4B. In a case where the impedance control circuits 21b and 21a are not provided in the receiving device 15, a ringing of the received signal occurs as illustrated in FIG. 5A. However, in a case where the impedance control circuits 21b and 21a are provided in the receiving device 15, the ringing of the received signal can be restricted effectively, as illustrated in FIG. 5B.

As described above, the receiving device 15 according to the present embodiment includes the impedance control circuits 21a and 21b. The impedance control circuit 21a includes the MOSFET 22a and the resistance element 23a coupled in series between the signal lines 12a and 12b. The threshold value of the MOSFET 22a can be controlled by the resistance element 24a coupled between the back-gate of the MOSFET 22a and the signal line 12b. When the voltage of the received signal is greater than the threshold value of the MOSFET 22a, the MOSFET 22a is activated and the resistance element 23a is coupled between the signal lines 12a and 12b. Thus, the input impedance of the receiving circuit 16 can be changed immediately. Similarly, the impedance control circuit 21b includes the MOSFET 22b and the resistance element 23b coupled in series between the signal lines 12a and 12b. The threshold value of the MOSFET 22b can be controlled by the resistance element 24b coupled between the back-gate of the MOSFET 22b and the signal line 12a. When the voltage of the received signal is less than the threshold value of the MOSFET 22b, the MOSFET 22b is activated and the resistance element 23b is coupled between the signal lines 12a and 12b. Thus, the input impedance of the receiving circuit 16 can be changed immediately.

Figure 6A:
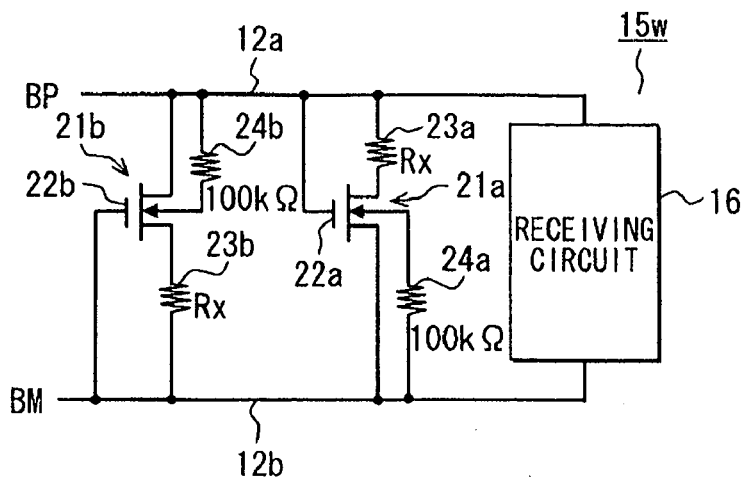
FIG. 6A is a circuit diagram illustrating a receiving device according to a first modification of the third embodiment.
Figure 6B:
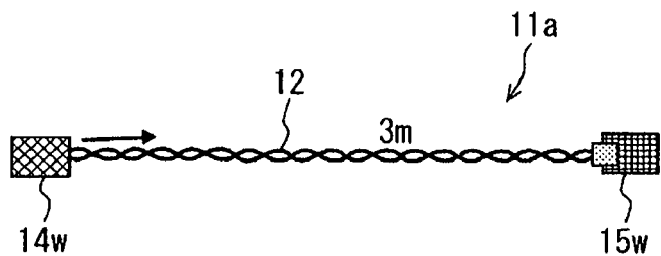
FIG. 6B is a diagram illustrating a communication network including a transmitting device and the receiving device according to the first modification of the third embodiment.

In a receiving device 15w according to a first modification of the third embodiment, each of the resistance elements 24a and 24b has a resistance value of about 100 kΩ and each of the resistance elements 23a and 23b has a resistance value of Rx, as illustrated in FIG. 6A. The receiving device 15w can be used for a communication network 11a and can be coupled with a transmitting device 14w through the communication line 12, as illustrated in FIG. 6B. A length of the communication line 12 between the receiving device 15w and the transmitting device 14w is about 3 m.

Figure 6C:
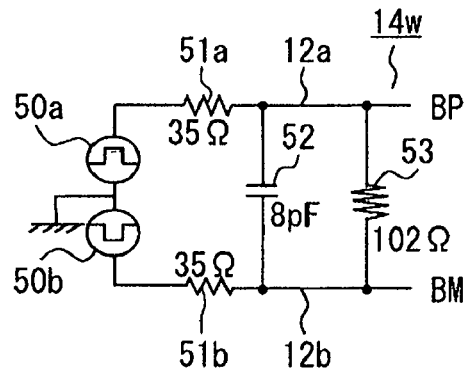
FIG. 6C is a circuit diagram illustrating the transmitting device.
Figure 6D:
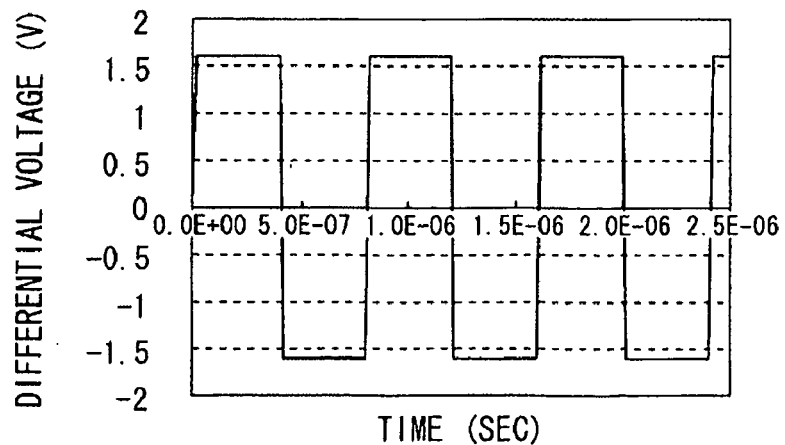
FIG. 6D is a graph illustrating a waveform of a signal transmitted from the transmitting device.

The transmitting device 14 includes rectangular-wave generators 50a and 50b, resistance elements 51a and 51b, a capacitor 52, and a resistance element 53, as illustrated in FIG. 6C. The rectangular-wave generator 50a and the resistance element 51a are coupled with the signal line 12a. The rectangular-wave generator 50b and the resistance element 51b are coupled with the signal line 12b. The capacitor 52 and the resistance element 53 are coupled between the signal lines 12a and 12b. Each of the resistance elements 51a and 51b has a resistance value of about 35Ω, the resistance element 53 has a resistance value of about 102Ω, and the capacitor 52 has a capacitance of about 8 pF. The transmitting device 14w transmits a signal having a waveform as illustrated in FIG. 6D. A characteristic impedance of the communication line 12 is about 102Ω.

Figure 7A:
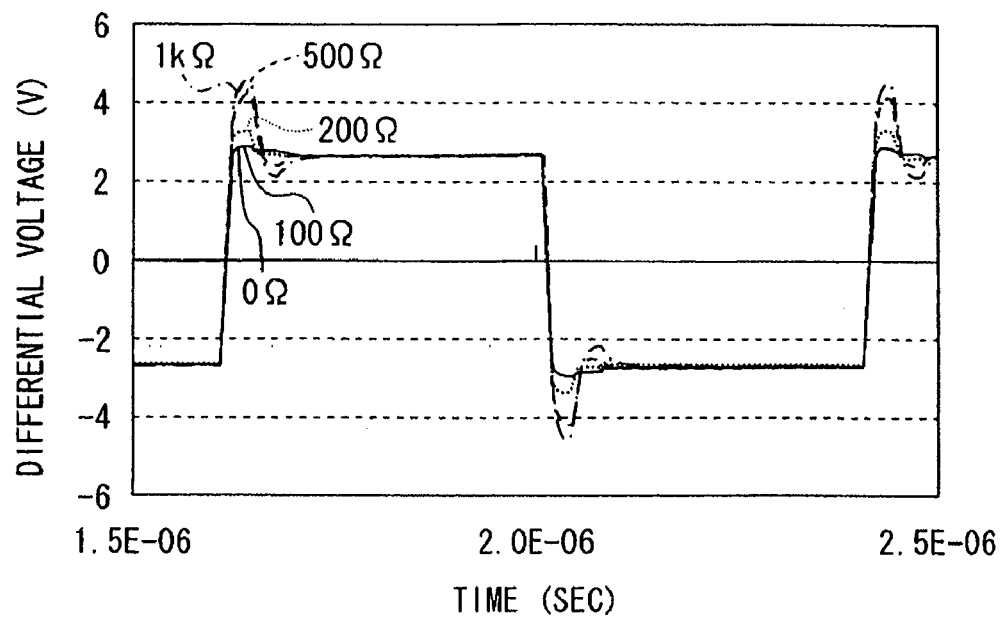
FIG. 7A and FIG. 7B are graphs illustrating relationships between waveforms of signals and resistance values of resistances in the receiving device according to the first modification of the third embodiment.
Figure 7B:
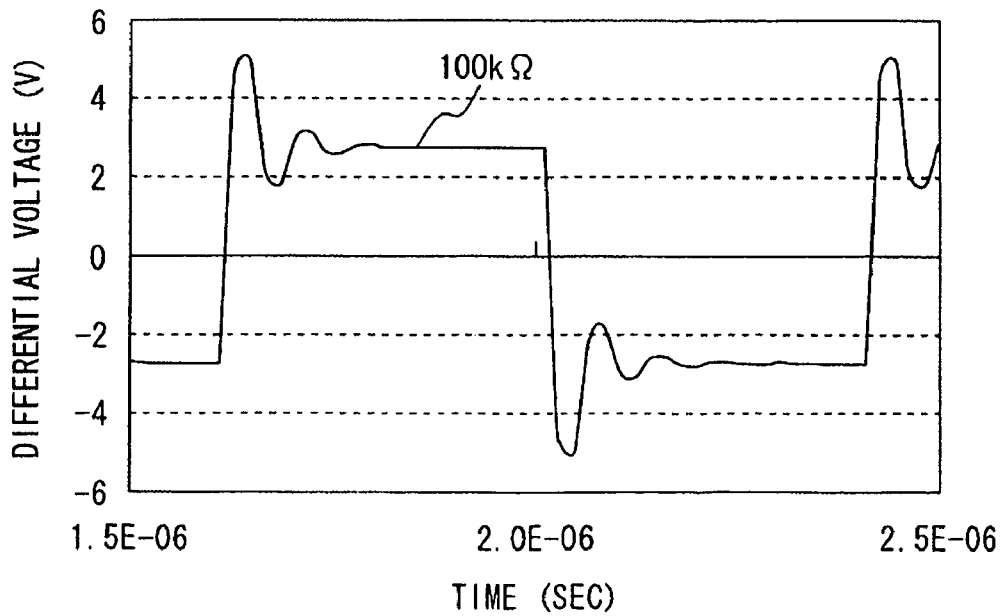

The resistance value Rx of each of the resistance elements 23a and 23b of the receiving device 15w is set at 0Ω, about 100Ω, about 200Ω, about 500Ω, about 1 kΩ or about 100 kΩ. When the resistance value Rx is set in a range from 0Ω to about 500Ω, a bounce of an overshooting and an undershooting can be restricted, as illustrated in FIGS. 7A and 7B. Thus, in the communication network illustrated in FIG. 6B, a ringing of the waveform of the differential signal can be effectively reduced when the resistance value Rx of the resistance elements 23a and 23b is less than or equal to about 5 times of the impedance of the communication line 12, that is, about 510Ω.

Figure 8A:
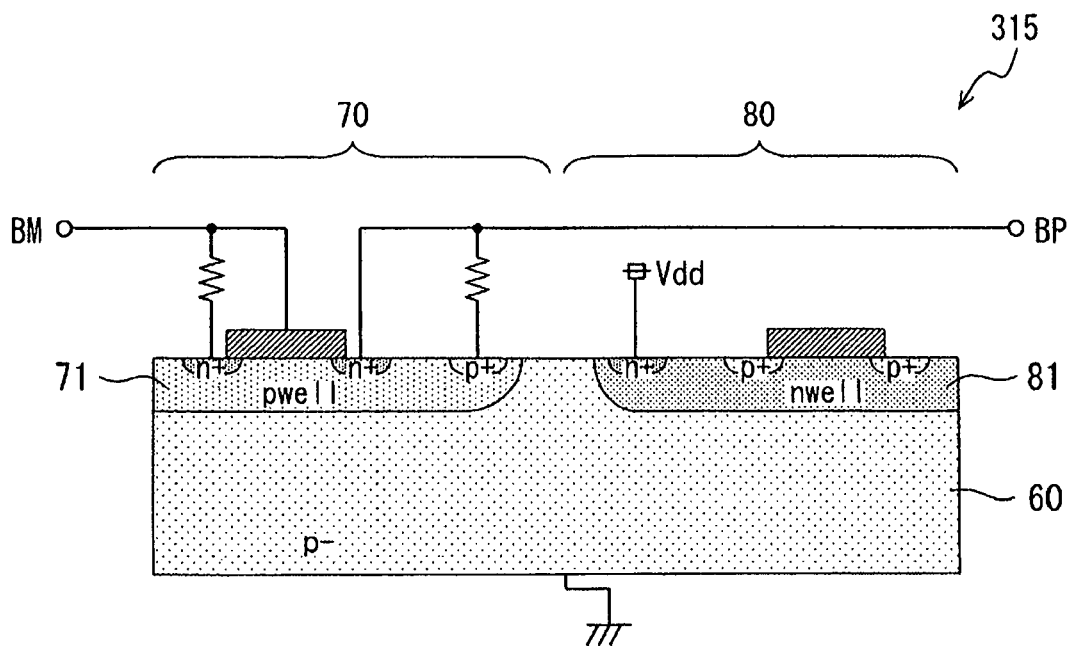
FIG. 8A is a cross-sectional diagram illustrating a periphery of an impedance control circuit of a receiving device according to a comparative example and FIG. 8B is an equivalent circuit diagram illustrating the receiving device according to the comparative example.
Figure 8B:
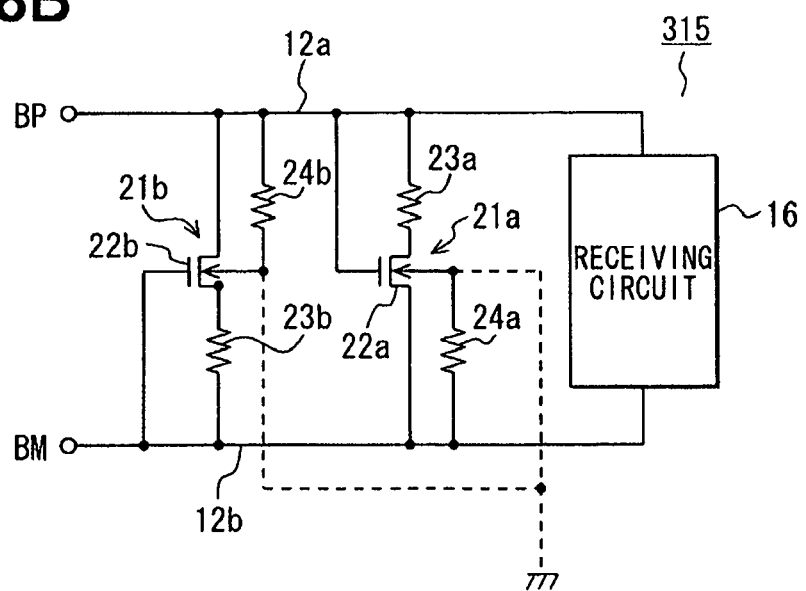

In the receiving device 15 according to the third embodiment, each of the impedance control circuits 21a and 21b can be formed by a process for forming a complementary metal-oxide semiconductor (CMOS), for example. A receiving device 315 according to a comparative example includes the impedance control circuits 21a and 21b and the receiving circuit 16. In a periphery of the impedance control circuit 21b of the receiving device 315, which corresponds to an area IV in FIG. 4C, an N channel MOSFET 70 and a P channel MOSFET 80 are formed in a substrate 60 having a p– conductivity type, as illustrated in FIG. 8A. The N channel MOSFET 70 corresponds to the MOSFET 22b illustrated in FIG. 4C. The P channel MOSFET 80 is not illustrated in FIG. 4C. The N channel MOSFET 70 includes a P well 71. The P channel MOSFET 80 includes an N well 81. In the receiving device 315, the P well 71 of the N channel MOSFET 70 (MOSFET 22b), which should be coupled with the signal line 12a through the resistance element 24b, may short to the ground through the substrate 60, as illustrated in FIG. 8B.

Figure 9A:
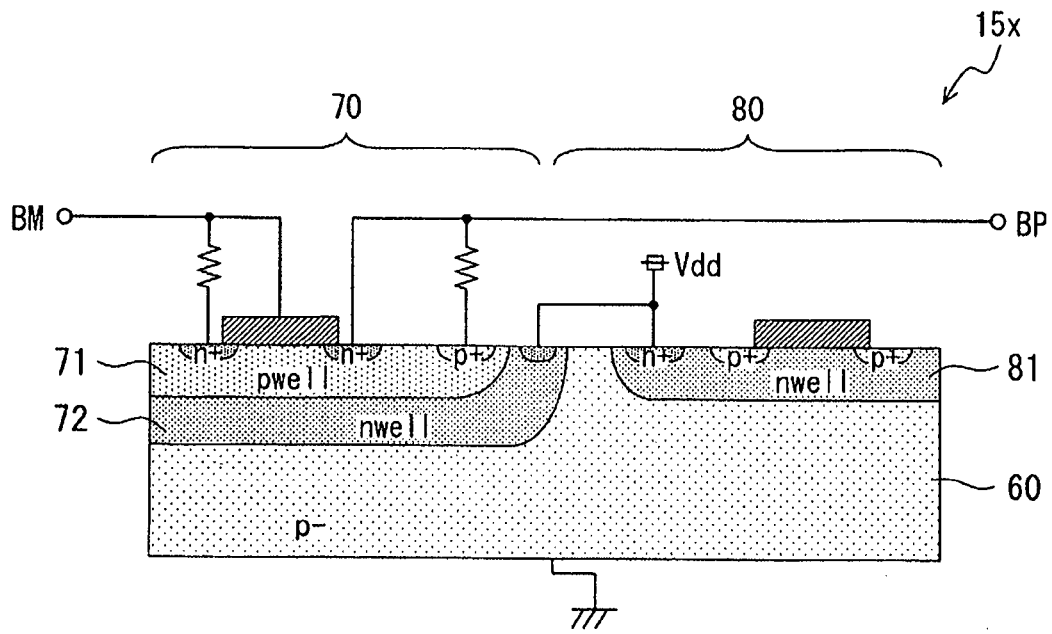
FIG. 9A is a cross-sectional diagram illustrating a periphery of an impedance control circuit of a receiving device according to a second modification of the third embodiment and FIG. 9B is an equivalent circuit diagram illustrating the receiving device according to the second modification of the third embodiment.
Figure 9B:
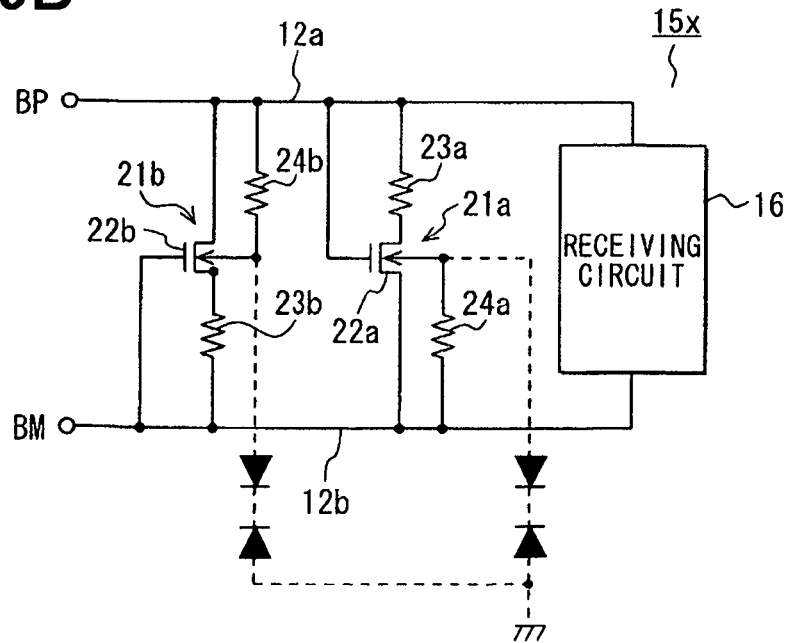

In a receiving device 15x according to a second modification of the third embodiment, an N well 72 is disposed between the substrate 60 and the P well 71, as illustrated in FIG. 9A. In the present case, a PN junction is provided between the N well 72 and the substrate 60, and thereby a short of the P well 71 to the ground can be restricted, as illustrated in FIG. 9B. The receiving device 15x includes a bipolar structure configured by the P well 71, the N well 72, and the substrate 60. Thus, the receiving device 15x has a concern that a parasitic behavior may occur. However, the parasitic behavior can be reduced by fixing a potential of the N well 72 at a high voltage, for example, a power supply voltage Vdd. In the receiving device 15x, the N well 72 is separated from the N well 81 by the substrate 60. Alternatively, the N well 72 and the N well 81 may be integrated.

Figure 10A:
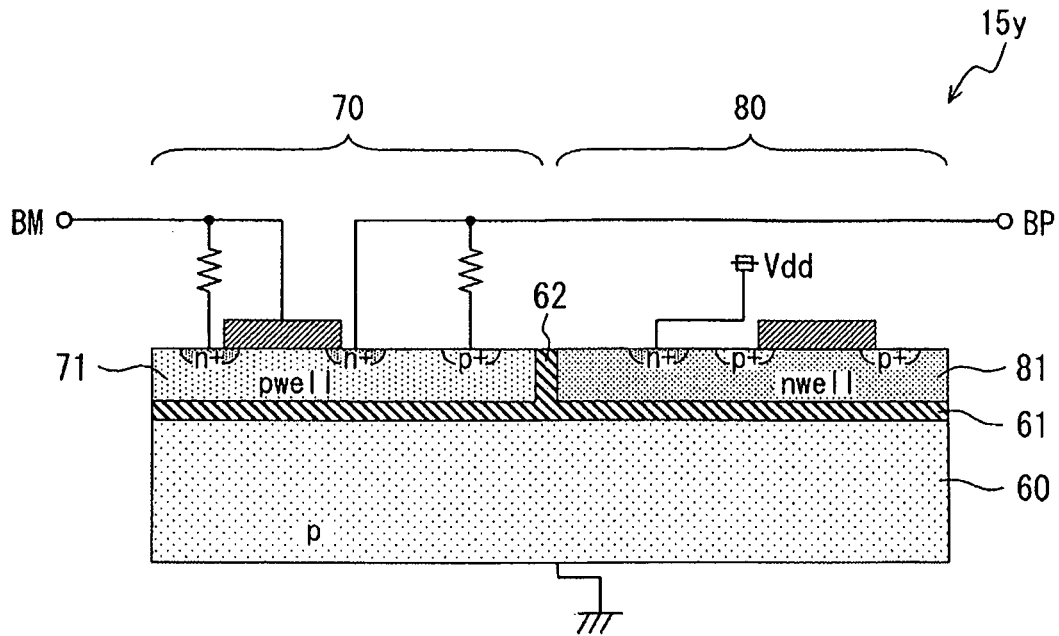
FIG. 10A is a cross-sectional diagram illustrating a periphery of an impedance control circuit of a receiving device according to a third modification of the third embodiment and FIG. 10B is an equivalent circuit diagram illustrating the receiving device according to the third modification of the third embodiment.
Figure 10B:
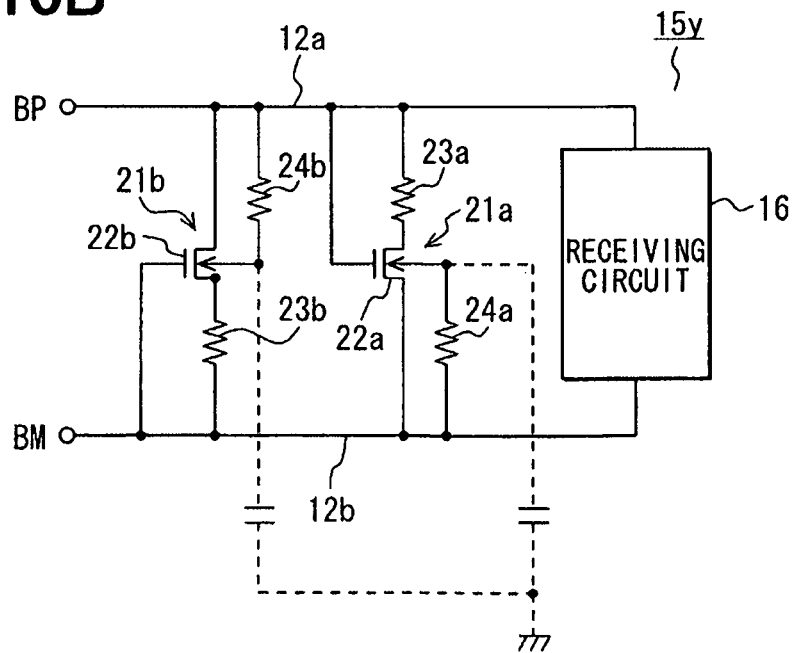

In a receiving device 15y according to a third modification of the third embodiment, a buried insulating layer 61 is disposed on the substrate 60, and the P well 71 and the N well 81 are disposed on the buried insulating layer 61, as illustrated in FIG. 10A. In addition, the P well 71 is isolated from the N well 81, for example, by a trench 62. Because the N channel MOSFET 70 is isolated from other components, a short to the ground can be restricted, as illustrated in FIG. 10B. The substrate 60 may also have an n conductivity type. The substrate 60 may not be coupled with the ground.

In a receiving device 15z according to a fourth modification of the third embodiment, a layer 63 having a p– conductivity type is disposed between the P well 71 and the buried insulating layer 61 and between the N well 81 and the buried insulating layer 61. Also in the present case, a short to the ground can be restricted. The layer 63 may also have an n– conductivity type. A potential of the layer 63 may not be fixed.

(Fourth Embodiment)

Figure 12:
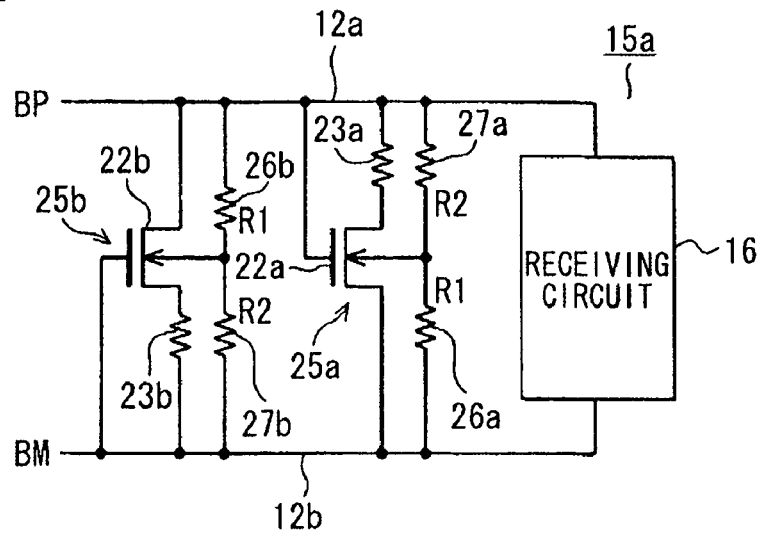
FIG. 12 is a circuit diagram illustrating a receiving device according to a fourth embodiment of the present invention.

A receiving device 15a according to a fourth embodiment of the present invention will be described with reference to FIG. 12. The receiving device 15a includes impedance control circuits 25a and 25b. The impedance control circuit 25a includes the MOSFET 22a and the impedance control circuit 25b includes the MOSFET 22b. The gate of the MOSFET 22a is coupled with the signal line 12a. The drain of the MOSFET 22a is coupled with the signal line 12a through the resistance element 23a. The source of the MOSFET 22a is coupled with the signal line 12b. The impedance control circuit 25a further includes resistance element 26a and 27a coupled in series between the signal lines 12a and 12b. The back-gate of the MOSFET 22a is coupled with a common connecting point of the resistance elements 26a and 27a. The gate of the MOSFET 22b is coupled with the signal line 12b. The drain of the MOSFET 22b is coupled with the signal line 12b through the resistance element 23b. The source of the MOSFET 22b is coupled with the signal line 12a. The impedance control circuit 25b further includes resistance element 26b and 27b coupled in series between the signal lines 12a and 12b. The back-gate of the MOSFET 22b is coupled with a common connecting point of the resistance elements 26b and 27b. Each of the resistance elements 26a and 26b has a resistance value R1. Each of the resistance elements 27a and 27b has a resistance value R2. The resistance values R1 and R2 are set to be high so that the resistance elements 26a, 26b, 27a, and 27b do not affect a differential impedance of the receiving device 15a.

In the receiving device 15a, the threshold value of the MOSFET 22a can be controlled with a partial voltage ratio of the resistance element 26a and the resistance element 27a that determines a voltage of the back-gate of the MOSFET 22a. The threshold voltage of the MOSFET 22b can be controlled with a partial pressure ratio of the resistance element 26b and the resistance element 27b that determines a voltage of the back-gate of the MOSFET 22b.

Figure 11:
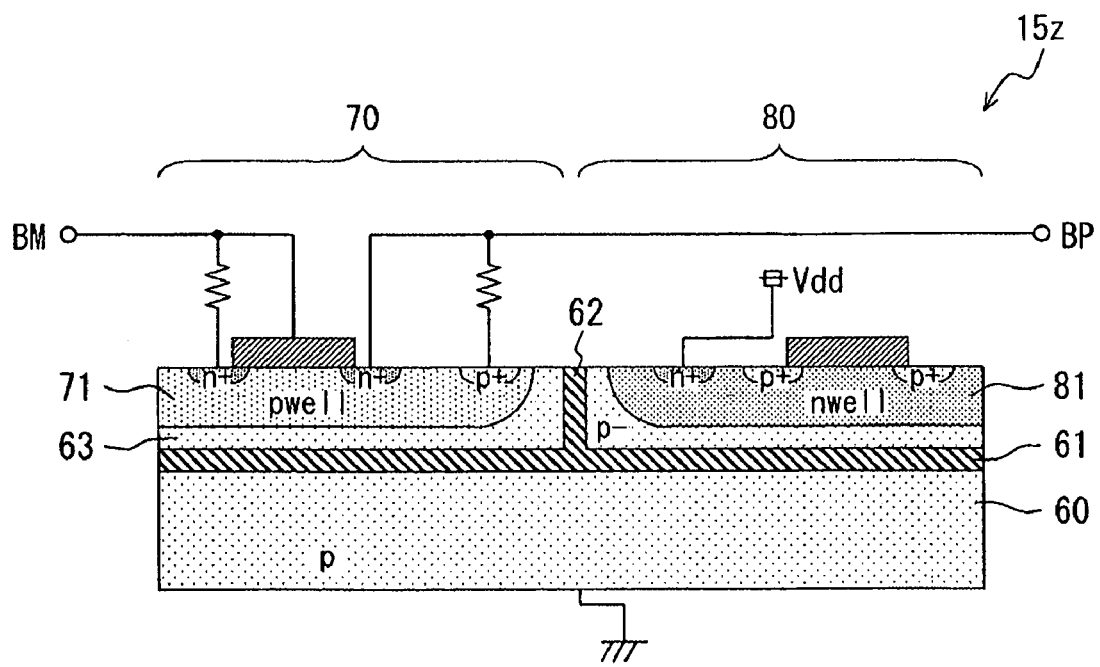
FIG. 11 is a cross-sectional diagram illustrating a periphery of an impedance control circuit of a receiving device according to a fourth modification of the third embodiment.

In the receiving device 15a, a periphery of each of the impedance control circuits 25a and 25b may have a structure similar to the CMOS structure illustrated in FIG. 9A, FIG. 10A or FIG. 11.

(Fifth Embodiment)

Figure 13:
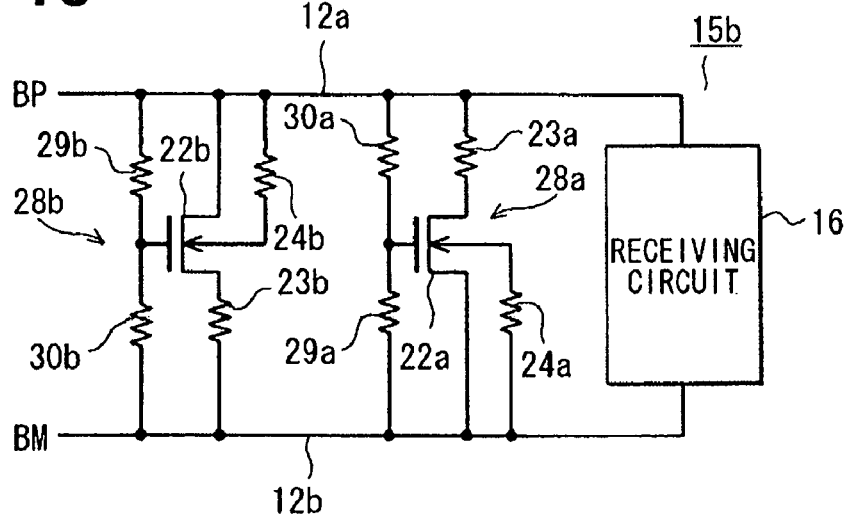
FIG. 13 is a diagram illustrating a receiving device according to a fifth embodiment of the present invention.

A receiving device 15b according to a fifth embodiment of the present invention will be described with reference to FIG. 13. The receiving device 15b includes impedance control circuits 28a and 28b. The impedance control circuit 28a includes the MOSFET 22a and the impedance control circuit 28b includes the MOSFET 22b. The impedance control circuit 28a further includes resistance elements 29a and 30a coupled in series between the signal lines 12a and 12b. The resistance elements 29a and 30a can function as a gate bias circuit. The gate of the MOSFET 22a is coupled with a common connecting point of the resistance elements 29a and 30a. The drain of the MOSFET 22a is coupled with the signal line 12a through the resistance element 23a. The source of the MOSFET 22a is coupled with the signal line 12b. The back-gate of the MOSFET 22a is coupled with the signal line 12b through the resistance element 24a. The impedance control circuit 28b further includes resistance elements 29b and 30b coupled in series between the signal lines 12a and 12b. The resistance elements 29b and 30b can function as a gate bias circuit. The gate of the MOSFET 22b is coupled with a common connecting point of the resistance elements 29b and 30b. The drain of the MOSFET 22b is coupled with the signal line 12b through the resistance element 23b. The back-gate of the MOSFET 22b is coupled with the signal line 12a through the resistance element 24b. Resistance values of the resistance elements 29a, 29b, 30a, and 30b are set to be high so that the resistance elements 29a, 29b, 30a, and 30b do not affect a differential impedance of the receiving device 15b.

In the receiving device 15b, the threshold value of the MOSFET 22a can be controlled with a partial voltage ratio of the resistance element 29a and the resistance element 30a that determines a gate voltage of the MOSFET 22a. In addition, the threshold value of the MOSFET 22b can be controlled with a partial voltage ratio of the resistance element 29b and the resistance element 30b that determines a gate voltage of the MOSFET 22b. Each of the MOSFETs 22a and 22b can be activated within a linear region by setting the partial voltage ratio accordingly. Thereby, the input impedance can be changed at a certain inclination as illustrated in FIG. 2. In the receiving device 15b, the resistance elements 24a and 24b may be removed and the threshold values may be controlled only by the resistance elements 29a, 29b, 30a, and 30b.

In the receiving device 15b, a periphery of each of the impedance control circuits 28a and 28b may have a structure similar to the CMOS structure illustrated in FIG. 9A, FIG. 10A or FIG. 11.

(Sixth Embodiment)

Figure 14:
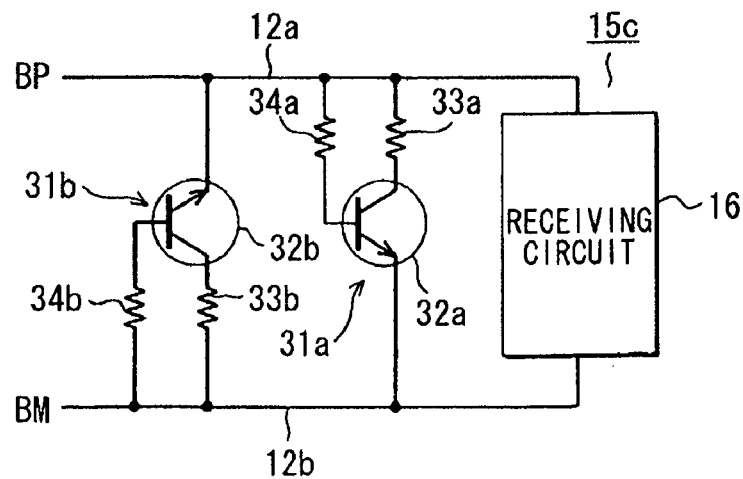
FIG. 14 is a circuit diagram illustrating a receiving device according to a sixth embodiment of the present invention.

A receiving device 15c according to a sixth embodiment of the present invention will be described with reference to FIG. 14. The receiving device 15 C includes impedance control circuits 31a and 31b. The impedance control circuit 31a includes an NPN transistor 32a. The impedance control circuit 31b includes an NPN transistor 32b. The NPN transistors 32a and 32b can function as semiconductor switching elements. An emitter of the transistor 32a is coupled with the signal line 12b. A collector of the transistor 32a is coupled with the signal line 12a through a resistance element 33a. A base of the transistor 32a is coupled with the signal line 12a through a resistance element 34a. An emitter of the transistor 32b is coupled with the signal line 12a. A collector of the transistor 32b is coupled with the signal line 12b through a resistance element 33b. A base of the transistor 32b is coupled with the signal line 12b through a resistance element 34b. The resistance elements 33a and 33b can function as impedance elements. The resistance elements 34a and 34b can function as base bias circuits.

In the impedance control circuit 31a, when a voltage of the signal line 12a with respect to the signal line 12b is greater than about 0.7 V, a base current flows and the transistor 32a is activated. Thereby, the resistance element 33a is coupled between the signal lines 12a and 12b and the input impedance of the receiving circuit 16 is reduced. In addition, in the impedance control circuit 31b, when a voltage of the signal line 12b with respect to the signal line 12a is greater than about 0.7 V, the transistor 32b is activated and the resistance element 33b is coupled between the signal lines 12a and 12b. Thereby, the input impedance of the receiving circuit 16 is reduced. Thus, in the receiving device 15c, effects similar to the effects of the receiving device 15 illustrated in FIG. 4C can be obtained.

(Seventh Embodiment)

Figure 15:
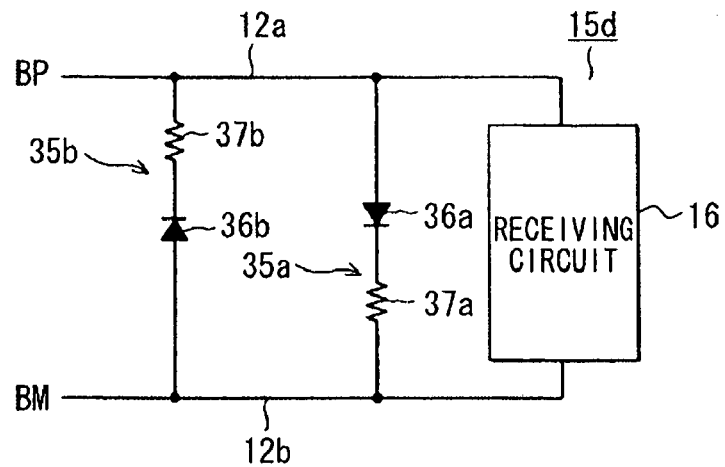
FIG. 15 is a circuit diagram illustrating a receiving device according to a seventh embodiment of the present invention.

A receiving device 15d according to a seventh embodiment of the present invention will be described with reference to FIG. 15. The receiving device 15d includes impedance control circuits 35a and 35b. The impedance control circuit 35a includes a diode 36a and a resistance element 37a coupled in series. The diode 36a can function as a semiconductor switching element. The resistance element 37a can function as an impedance element. An anode of the diode 36a is coupled with the signal line 12a. A cathode of the diode 36a is coupled with the signal line 12b through the resistance element 37a. The impedance control circuit 35b includes a diode 36b and a resistance element 37b coupled in series. The diode 36b can function as a semiconductor switching element. The resistance element 37b can function as an impedance element. An anode of the diode 36b is coupled with the signal line 12b. A cathode of the diode 36b is coupled with the signal line 12a through the resistance element 37b.

In the impedance control circuit 35a, when a voltage of the signal line 12a with respect to the signal line 12b is greater than a forward threshold voltage, for example, about 0.7 V, the diode 36a is activated and the resistance element 37a is coupled between the signal lines 12a and 12b. Thus, the input impedance of the receiving circuit 16 is reduced by an on-resistance of the diode 36a and a resistance of the resistance element 37a. In addition, in the impedance control circuit 35b, when a voltage of the signal line 12b with respect to the signal line 12a is greater than about 0.7 V, the diode 36b is activated and the resistance element 37b is coupled between the signal lines 12a and 12b. Thus, the input impedance of the receiving circuit 16 is reduced by an on-resistance of the diode 36b and a resistance of the resistance element 37b. Thus, in the receiving device 15d, effects similar to the effects of the receiving device 15 illustrated in FIG. 4C can be obtained. In addition, a circuit configuration of the receiving device 15d can be simplified compared with a circuit configuration of the receiving device 15.

(Eighth Embodiment)

Figure 16:
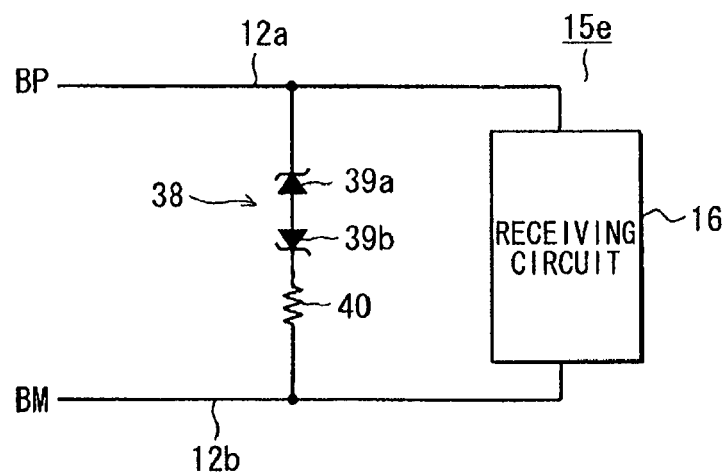
FIG. 16 is a circuit diagram illustrating a receiving device according to an eighth embodiment of the present invention.

A receiving device 15e according to an eighth embodiment of the present invention will be described with reference to FIG. 16. The receiving device 15e includes an impedance control circuit 38. The impedance control circuit 38 includes zener diodes 39a and 39b and a resistance element 40. The zener diodes 39a and 39b can function as semiconductor switching elements. The resistance element 40 can function as an impedance element. In the present case, a common configuration corresponds to a rising edge and a falling edge of a transmission signal.

In the impedance control circuit 38, when a voltage of the signal line 12a with respect to the signal line 12b is greater than a sum of a forward threshold voltage Vf of the zener diode 39b and a zener voltage Vz of the zener diode 39a, the zener diodes 39a and 39b are activated and the resistance element 40 is coupled between the signal lines 12a and 12b. Thus, the input impedance of the receiving circuit 16 is reduced by an on-resistance of the zener diode 39a, an one-resistance of the zener diode 39b, and a resistance of the resistance element 40. Similarly, when a voltage of the signal line 12b with respect to the signal line 12a is greater than a sum of the voltage Vf and the voltage Vz, the zener diodes 39a and 39b are activated and the resistance element 40 is coupled between the signal lines 12a and 12b. Thus, in the receiving device 15e, effects similar to the effects of the receiving device 15 illustrated in FIG. 4C can be obtained. In addition, a circuit configuration of the receiving device 15e can be simplified compared with a circuit configuration of the receiving device 15.

(Ninth Embodiment)

Figure 17:
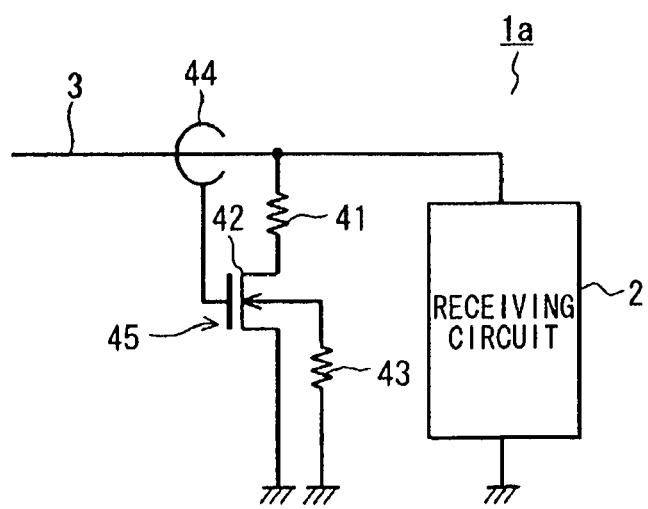
FIG. 17 is a circuit diagram illustrating a receiving device according to a ninth embodiment of the present invention.
Figure 18:
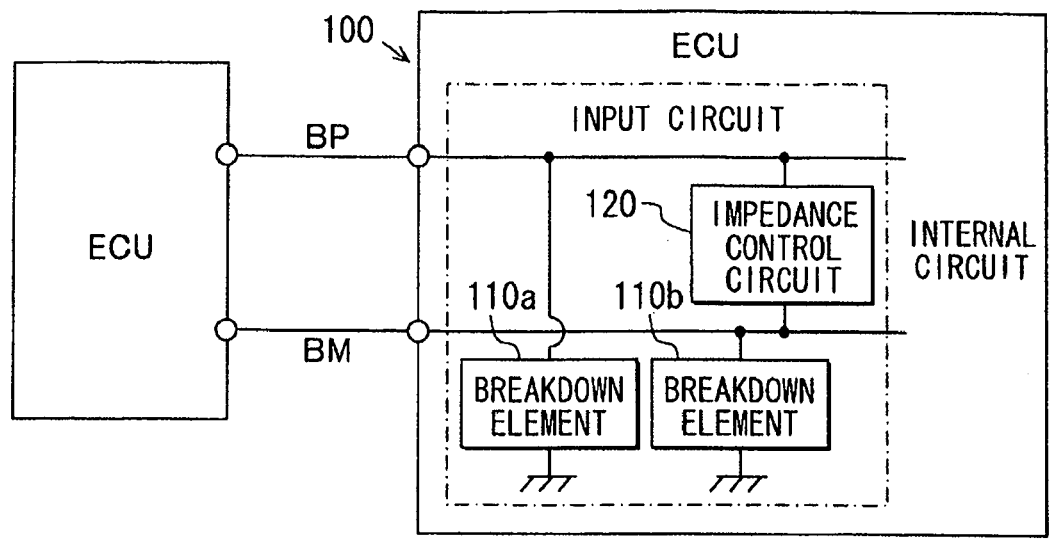
FIG. 18 is a block diagram illustrating a semiconductor device according to a tenth embodiment of the present invention.
Figure 19:
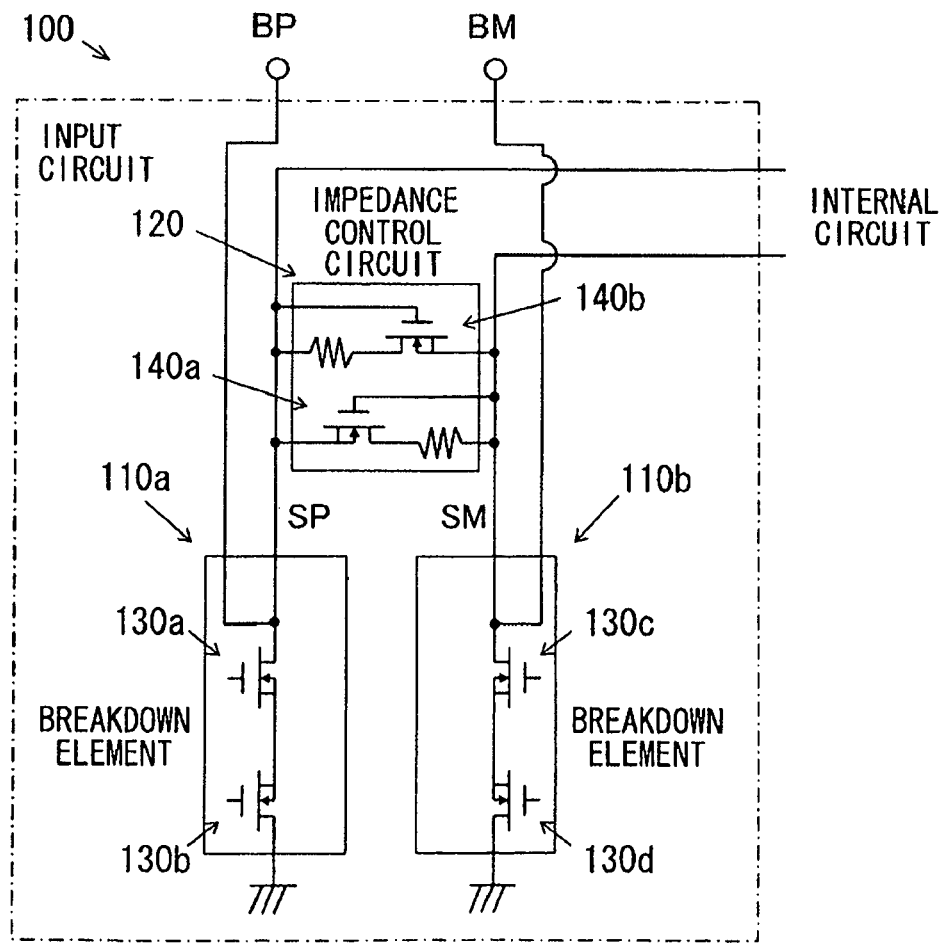
FIG. 19 is an equivalent circuit diagram illustrating the semiconductor device according to the tenth embodiment.

A receiving device 1a according to a ninth embodiment of the present invention will be described with reference to FIG. 17. The receiving device 1a includes the receiving circuit 2 and an impedance control circuit 45. The impedance control circuit 45 includes a resistance element 41 and an N channel MOSFET 42 coupled in series. The resistance element 41 can function as an impedance element. The N channel MOSFET can function as a semiconductor switching element. A back-gate of the MOSFET 42 is coupled with the ground through a resistance element 43. A gate of the MOSFET 42 is coupled with a current sensor 44 disposed on the communication line 3. The current sensor 44 can function as a detecting part.

When a signal is transmitted through the communication line 3 and a current value detected by the current sensor 44 is greater than a threshold value, the MOSFET 42 is activated and electric current is supplied to the resistance element 41. Thereby, the input impedance of the receiving circuit 2 can be changed so as to match the characteristic impedance Z0 of the communication line 3. As a result, a ringing of the signal can be restricted.

(Tenth Embodiment)

A semiconductor device 100 according to a tenth embodiment of the present invention will be described with reference to FIG. 18-FIG. 21.

The semiconductor device 100 may be provided in a vehicle and may be coupled with a differential communication line. The differential communication line is configured by a pair of phase conductors BP and BM.

The semiconductor device 100 includes an input circuit. The input circuit includes breakdown elements 110a and 110b and an impedance control circuit 120.

The breakdown element 110a is coupled between the phase conductor BP and one of a grounding line. The breakdown element 110b is coupled between the phase conductor BM and one of the grounding line. When the phase conductors BP and BM are applied with a surge having a voltage greater than a predetermined voltage, the breakdown elements 110a and 110b break down so that a surge current flow to the grounding line. The breakdown element 110a includes horizontal MOSFETs 130a and 130b that are symmetrically-coupled in series. The breakdown element 110b includes horizontal MOSFETs 130c and 130d that are symmetrically-coupled in series. In the semiconductor device 100 illustrated in FIG. 18 and FIG. 19, the breakdown element 110a is coupled between the phase conductor BP and the grounding line and the breakdown element 110b is coupled between the phased conductor BM and the groundling line. Alternatively, at least one of the breakdown elements 110a and 110b may be coupled between the respective phase conductors BP and BM and a power supply line. In the present case, when the phase conductors BP and BM are applied with a surge having a voltage greater than a predetermined voltage, a surge current flow to the power supply line.

The breakdown elements 110a and 110b do not affect an operation of the semiconductor device 100 when the semiconductor device 100 is normally operated. When the phase conductors BP and BP are applied with a surge, the breakdown elements 110a and 110b break down so that a surge current flows to the groundling line or the power supply line.

The impedance control circuit 120 is coupled between the phase conductors BP and BM. When a potential difference between the phase conductors BP and BM is greater than a predetermined voltage, an impedance of the impedance control circuit 120 reduces. The impedance control circuit 120 illustrated in FIG. 19 includes MOSFETs 140a and 140b. Alternatively, the impedance control circuit 120 may include a bipolar transistor.

Figure 22A:
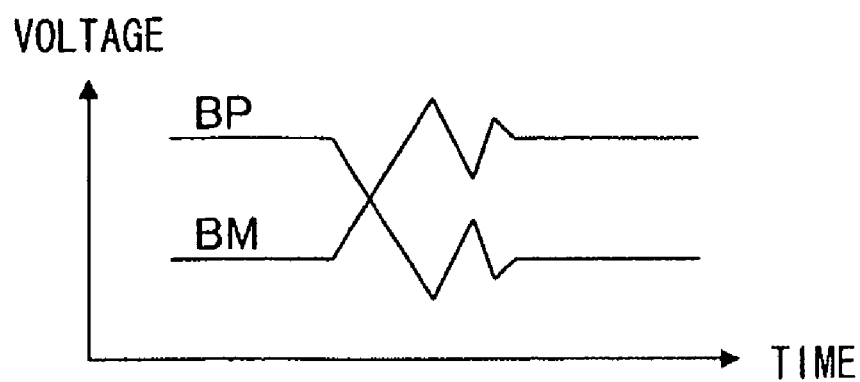
FIG. 22A is a graph illustrating waveforms of signals input from phase conductors of a differential communication line to an impedance control circuit and FIG. 22B is a graph illustrating waveforms of the signals after passing through the impedance control circuit.
Figure 22B:
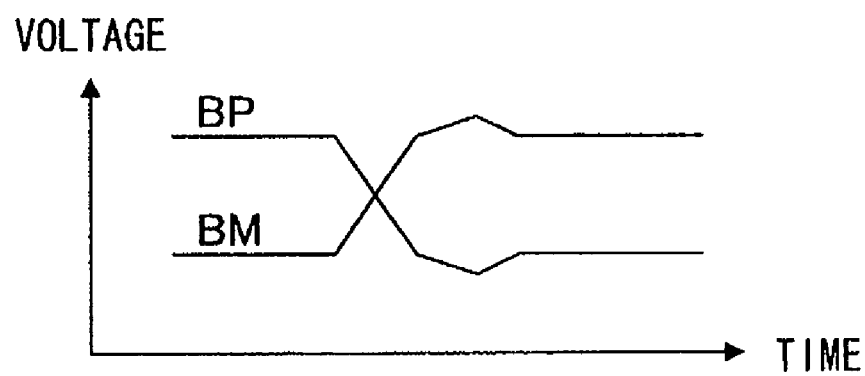

When a signal that rings as illustrated in FIG. 22A is input from the phase conductors BP and BM to the impedance control circuit 120, the impedance control circuit 120 reduces the impedance thereof so as to restrict the ringing of the signal as illustrated FIG. 22B. Thereby, a malfunction of the semiconductor device 100 due to the ringing can be restricted.

In the impedance control circuit 120, a potential difference between the phase conductors BP and BM is detected and an impedance between the phase conductors BP and BM is controlled in accordance with the potential difference. When the potential difference between the phase conductors BP and BM is low, the impedance between the phase conductors BP and BM is increased and a switching speed is increased. When the potential difference is greater than the predetermined voltage, the impedance is reduced and the switching speed is reduced. Thereby, a ringing of the voltage is reduced and noise is reduced. In addition, the potential difference between the phase conductors BP and BM can be maintained at a value required for a communication.

As described above, the breakdown element 110a includes the MOSFETs 130a and 130b that are symmetrically-coupled in series, and the breakdown element 110b includes the MOSFETs 130c and 130d that are symmetrically-coupled in series. Thus, the breakdown elements 110a and 110b can correspond to a case where the signal of each of the phase conductors BP and BM has both of a positive voltage and a negative voltage.

Figure 20:
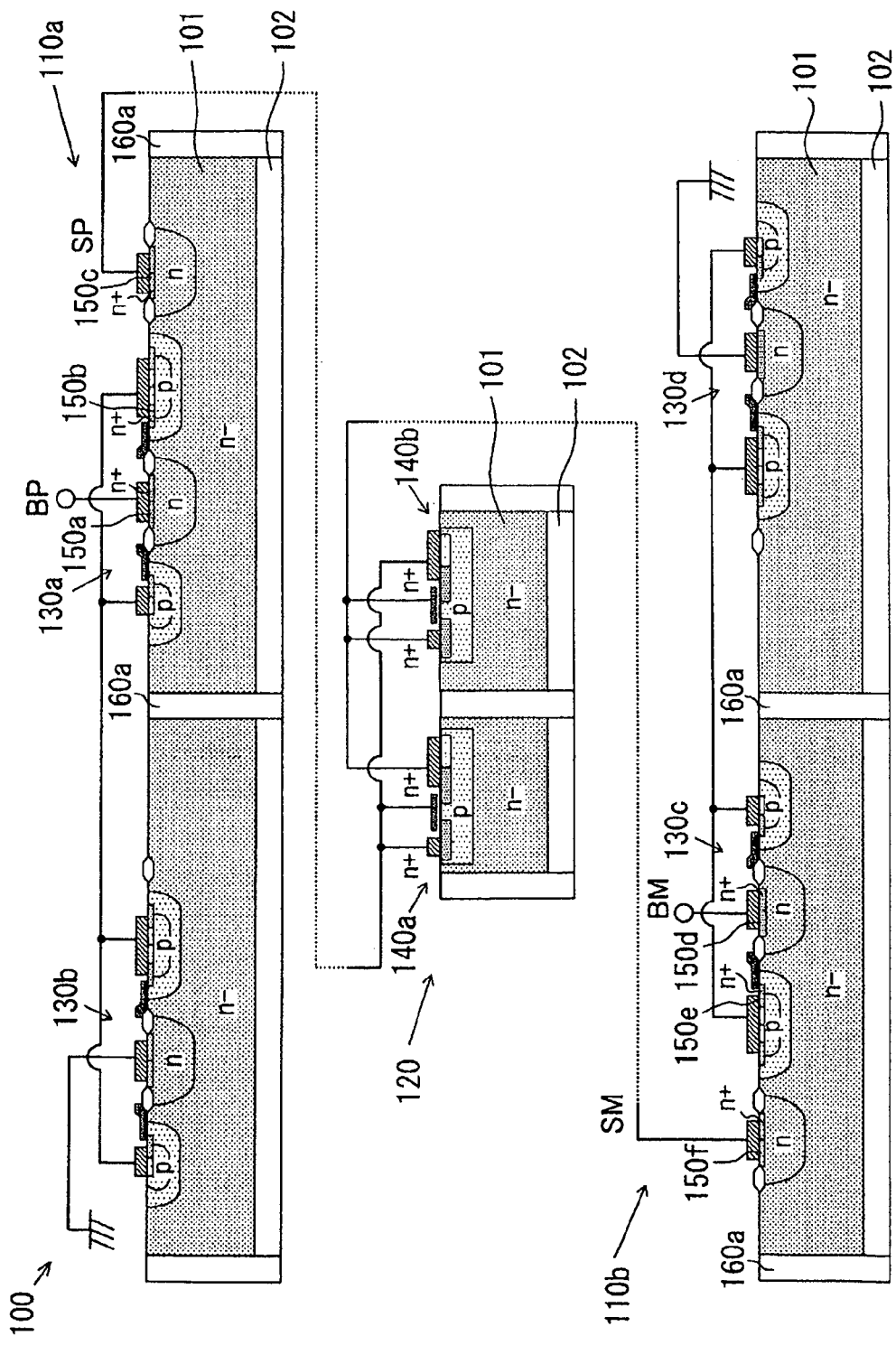
FIG. 20 is a cross-sectional diagram illustrating the semiconductor device according to the tenth embodiment.
Figure 21:
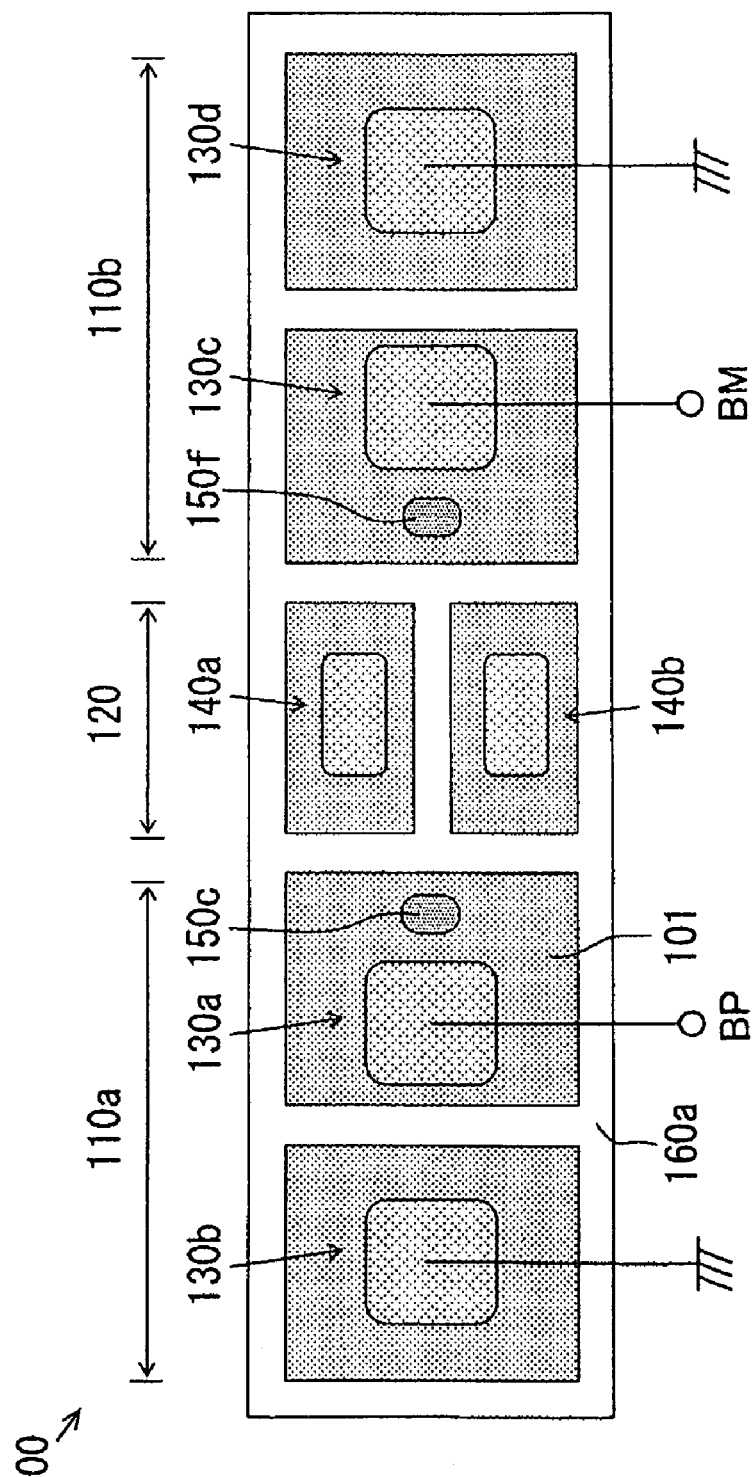
FIG. 21 is a top view illustrating the semiconductor device according to the tenth embodiment.

The semiconductor device 100 includes a semiconductor substrate 101 that has a silicon-on-insulator structure (SOI structure), as illustrated in FIG. 20. The semiconductor substrate 101 includes a buried oxide layer 102. An isolation trench 160a is provided in the semiconductor substrate 101 so as to extend to the buried oxide layer 102. The horizontal MOSFETs 130a, 130b, 130c, and 130d are located at respective SOI regions surrounded by the isolation trench 160a. In the SOI region where the MOSFET 130a of the breakdown element 110a is located, a first contact region 150a, a second contact region 150b, and a third contact region 150c are located. The first contact region 150a is a drain region of the MOSFET 130a. The second region 150b is a source region of the MOSFET 130a. The first contact region 150a and the third contact region 150c are located on opposite sides of the second contact region 150b. The first contact region 150a is coupled with the phase conductor BP. The second contact region 150b is coupled with the grounding line. The third contact region 150c is coupled with a line SP. The line SP couples the breakdown element 110a and the impedance control circuit 120. In the SOI region where the MOSFET 130c of the breakdown element 110b is located, a first contact region 150d, a second contact region 150e, and a third contact region 150f are located. The first contact region 150d is a drain region of the MOSFET 130c. The second contact region 150e is a source region of the MOSFET 130c. The first contact region 150d and the third contact region 150f are located on opposite sides of the second contact region 150e. The first contact region 150d is coupled with the phase conductor BM. The second contact region 150e is coupled with the grounding line. The third contact region 150f is coupled with a line SM. The line SM couples the breakdown element 110b and the impedance control circuit 120.

In the semiconductor device 100, the first contact regions 150a and 150d coupled with the respective phase conductors BP and BM are applied with a surge, a surge current rapidly flows from the first contact regions 150a and 150d to the corresponding second contact regions 150b and 150e coupled with the groundling line or the power supply line. Thus, the surge current is restricted from flowing to the third contact regions 150c and 150f coupled with the impedance control circuit 120. As a result, the semiconductor device 100 restricts a flow of a surge current to the internal circuit and the impedance control circuit 120. Therefore, the impedance control circuit 120 is restricted from being damaged by the surge current.

As described above, the semiconductor device 100 is coupled with the differential communication line. When the phase conductors of the BP and BM of the differential communication line are applied with a surge, a surge current can be restricted from flowing to the semiconductor device 100. In addition, a ringing of the input signal from the phase conductors BP and BM can be restricted. Thus, a malfunction of the semiconductor device 100 due to the ringing can be restricted.

(Eleventh Embodiment)

A semiconductor device 100a according to an eleventh embodiment of the present invention will be described with reference to FIG. 23-FIG. 25. In the cross-sectional diagram of the semiconductor device 100a illustrated in FIG. 24, the impedance control circuit 120 is not illustrated for a simplification.

The semiconductor device 100a includes breakdown elements 110c and 110d and the impedance control circuit 120. The breakdown element 110c includes the horizontal MOSFET 130a. The breakdown element 110d includes the horizontal MOSFET 130c. In a case where the input signal of each of the phase conductors BP and BM has only one of a positive voltage and a negative voltage, each of the breakdown elements 110c and 110d can introduce a surge current to the grounding line or the power supply line by using only one transistor.

Figure 24:
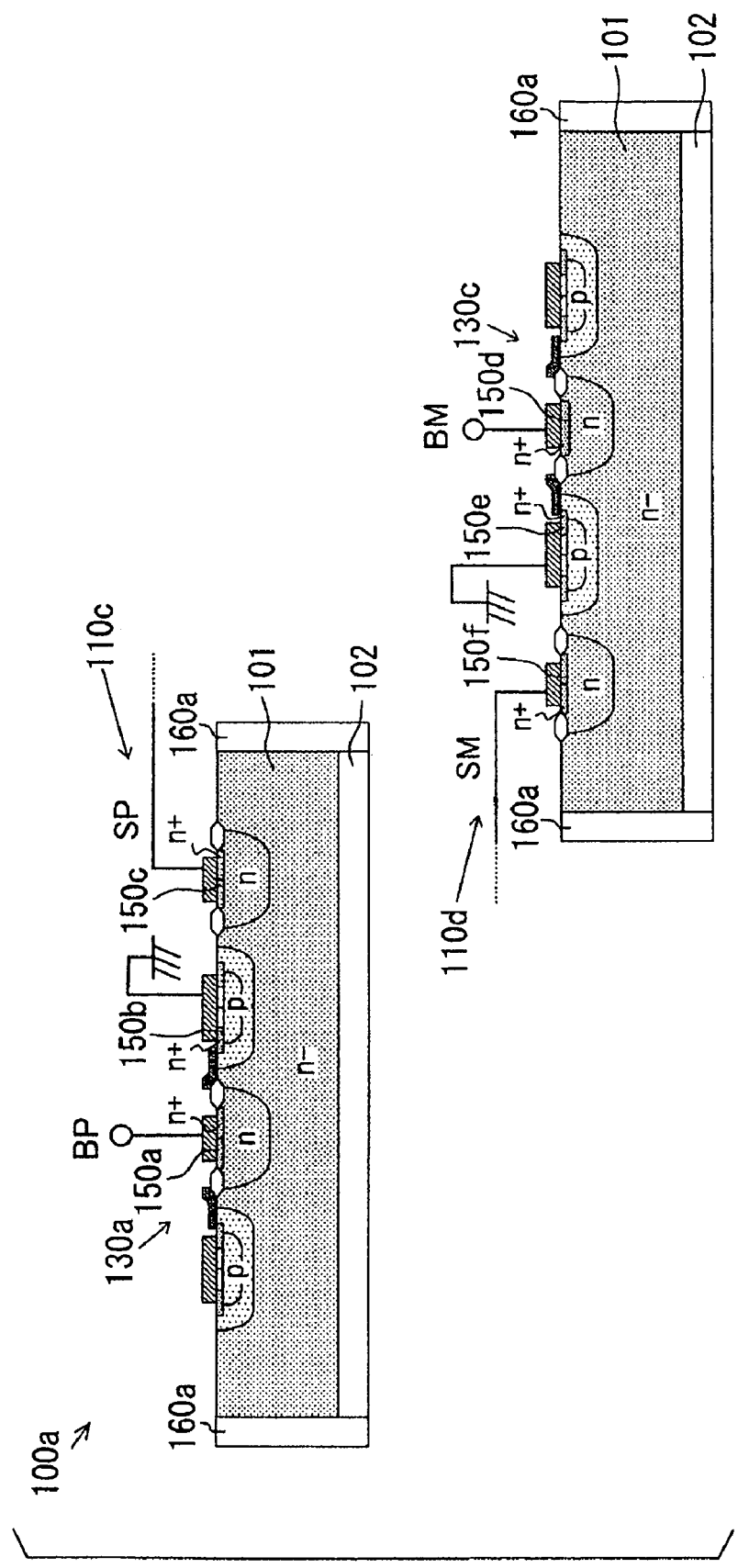
FIG. 24 is a cross-sectional diagram illustrating the semiconductor device according to the eleventh embodiment.

As illustrated in FIG. 24, in an SOI region where the MOSFET 130a of the breakdown element 110c is located, the first contact region 150a, the second contact region 150b, and the third contact region 150c are located. The first contact region 150a and the third contact region 150c are located on opposite sides of the second contact region 150b. The first contact region 150a is coupled with the phase conductor BP. The second contact region 150b is coupled with the grounding line. The third contact region 150c is coupled with the line SP. The line SP couples the breakdown element 110c and the impedance control circuit 120. In an SOI region where the MOSFET 130c of the breakdown element 110d is located, the first contact region 150d, the second contact region 150e, and the third contact region 150f are located. The first contact region 150d and the third contact region 150f are located on opposite sides of the second contact region 150e. The first contact region 150d is coupled with the phase conductor BM. The second contact region 150e is coupled with the grounding line. The third contact region 150f is coupled with the line SM. The line SM couples the breakdown element 110d and the impedance control circuit 120. Thus, the semiconductor device 100a restricts a surge current from flowing to the internal circuit and the impedance control circuit 120 in a manner similar to the semiconductor device 100. Therefore, the impedance control circuit 120 is restricted from being damaged by the surge current.

Figure 23:
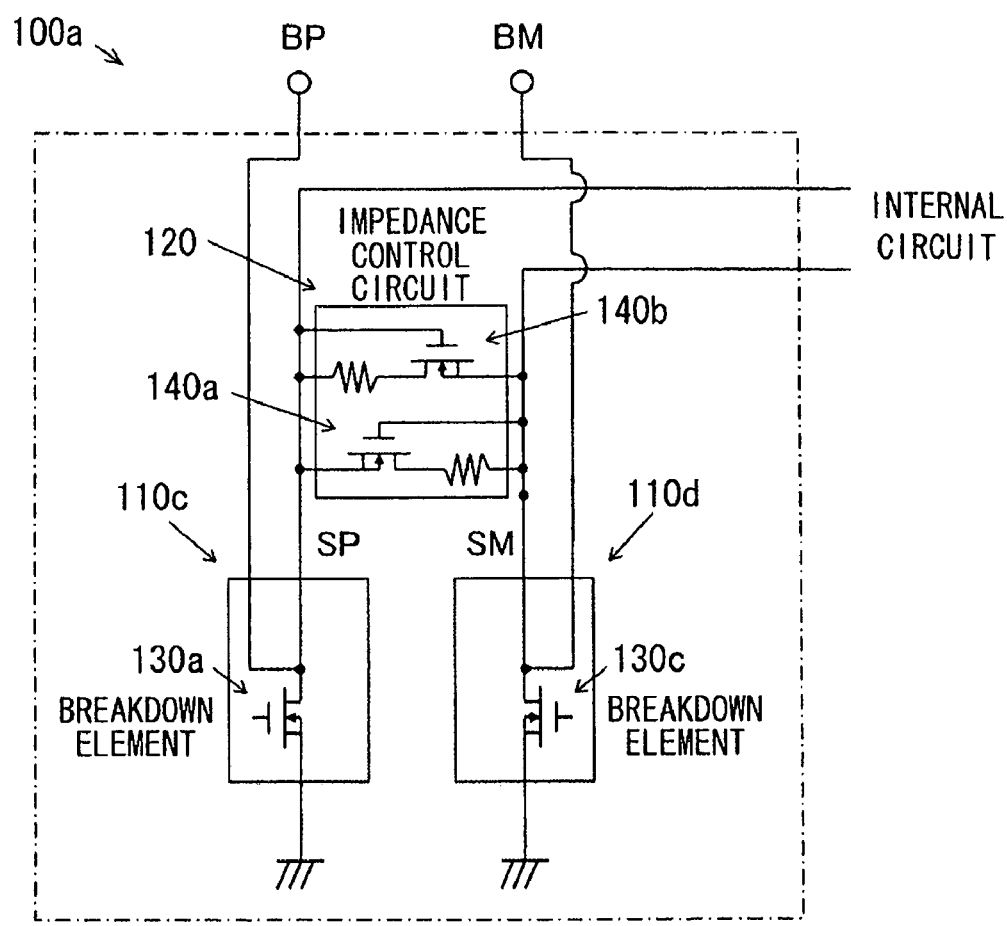
FIG. 23 is an equivalent circuit diagram illustrating a semiconductor device according to an eleventh embodiment of the present invention.
Figure 25:
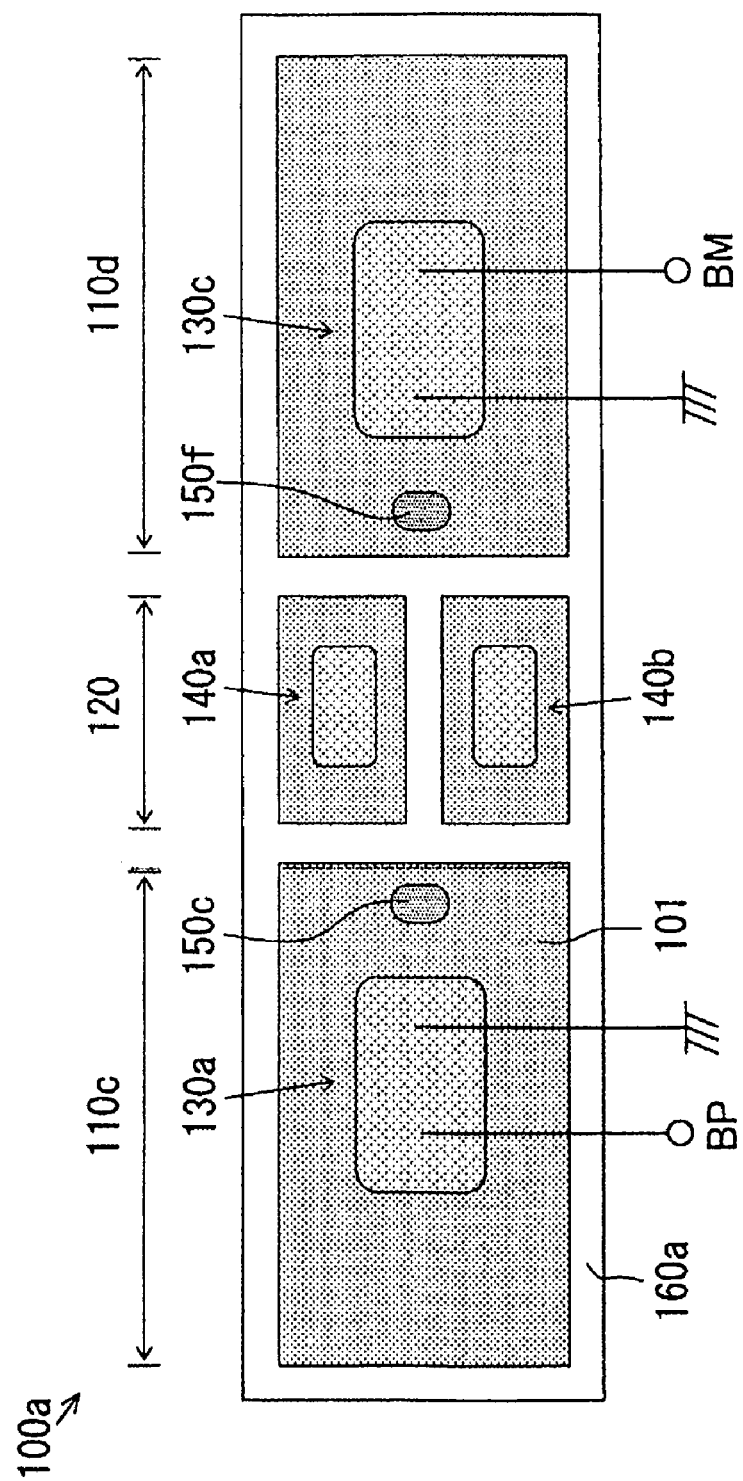
FIG. 25 is a top view illustrating the semiconductor device according to the eleventh embodiment.

The semiconductor device 100a illustrated in FIG. 23-FIG. 25 has a simple structure compared with the semiconductor device 100 illustrated in FIG. 18-FIG. 21. Thus, exemplary effect of the semiconductor devices 100 and 100a will be described with reference to FIG. 23-FIG. 25. In the breakdown element 110c in the semiconductor device 100a, when an ESD surge having a positive voltage is applied to the phase conductor BP, the ESD surge is applied from the first contact region 150a (drain region n+) to the semiconductor substrate 101 (SOI layer n−) through a drain region n. Then, a breakdown occurs between the semiconductor substrate 101 and a body region p of the horizontal MOSFET 130a, and a surge current flows through the second contact region (source region) 150b to the grounding line or the power supply which is coupled in a low impedance.

The third contact region (diffusion layer n+) 150c is located outside of the above-described pathway of the surge current and is coupled with the impedance control circuit 120 through the line SP. Thus, most part of the surge current flows to the second contact region (source region) 150b and the surge current is restricted from flowing to the impedance control circuit 120. The third contact region 150c is coupled with the first contact region (drain region n+) 150a through the semiconductor substrate 101 having the n conductivity type. The first contact region 150a is coupled with the phase conductor BP. Thus, a potential of the phase conductor BP is substantially similar to a potential of the line SP coupled with the impedance control circuit 120. In the above-described way, in the semiconductor device 100a, the impedance control circuit 120 can be restricted from being damaged by the surge current. The breakdown element 110d of the semiconductor device 100a can function in a manner similar to the breakdown element 110c.

In the semiconductor device 100a, the potential of the phase conductor BP is introduced to the impedance control circuit 120 through the line SP and the potential of the phase conductor BM is introduced to the impedance control circuit 120 through the line SM. Then, the impedance of the impedance control circuit 120 is controlled based on the potential difference between the phase conductors BP and BM, that is, the potential difference between the lines SP and SM.

(Twelfth Embodiment)

Figure 26:
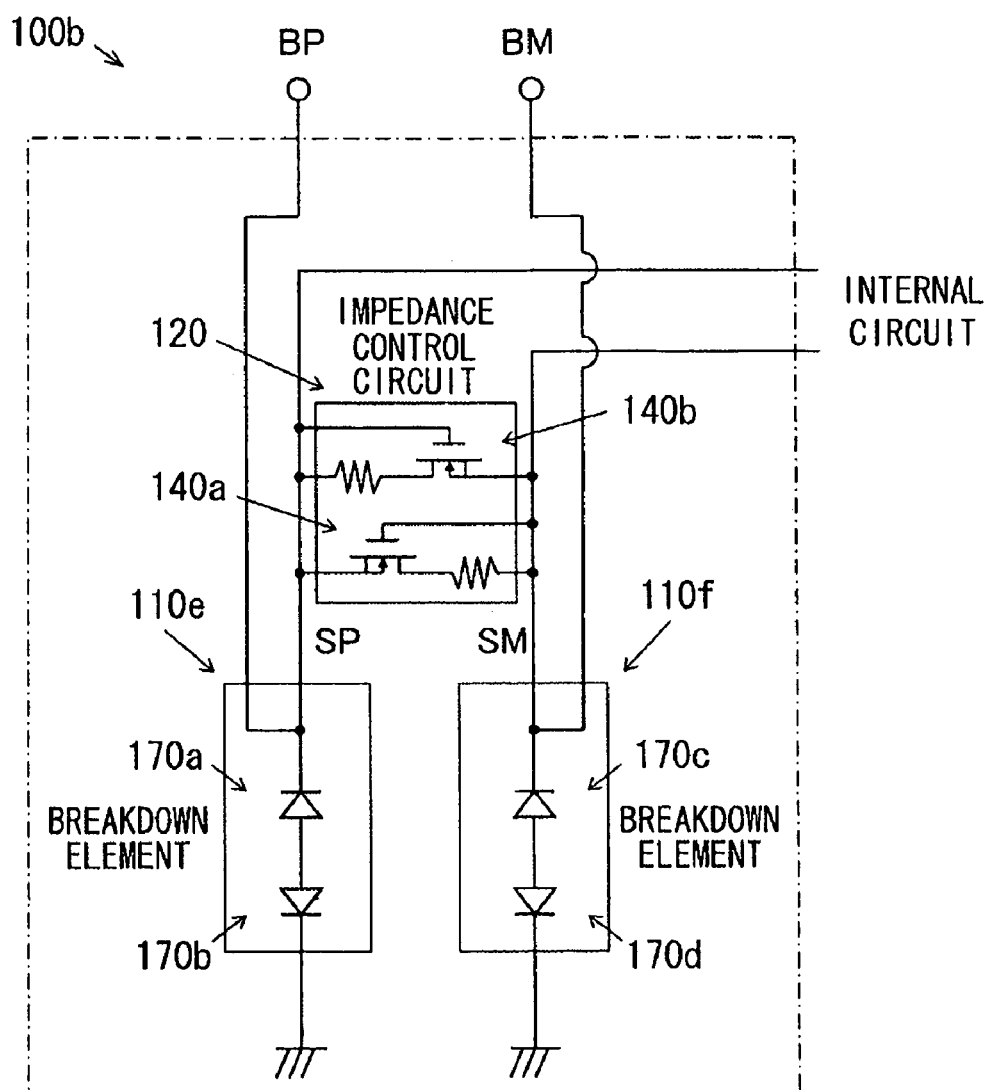
FIG. 26 is an equivalent circuit diagram of a semiconductor device according to a twelfth embodiment of the present invention.
Figure 27:
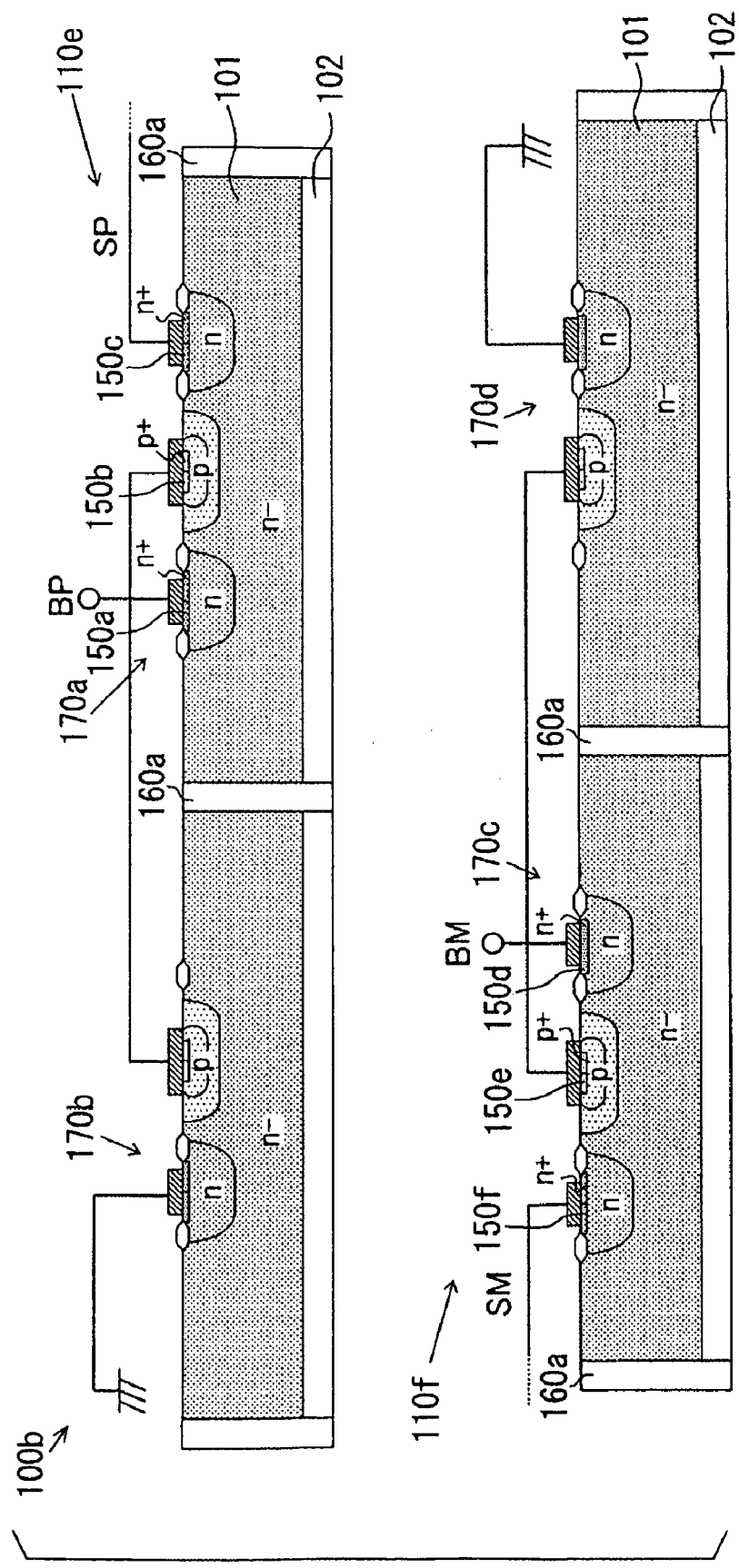
FIG. 27 is a cross-sectional diagram illustrating the semiconductor device according to the twelfth embodiment.

A semiconductor device 100b according to a twelfth embodiment of the present invention will be described with reference to FIG. 26 and FIG. 27.

The semiconductor device 100b includes breakdown elements 110e and 110f and the impedance control circuit 120. The breakdown element 110e includes diodes 170a and 170b that are symmetrically-coupled in series. The breakdown element 110f includes diodes 170c and 170d that are symmetrically-coupled in series.

In an SOI region where the diode 170a of the breakdown element 110e is located, the first contact region 150a, the second contact region 150b, and the third contact region 150c are located. The first contact region 150a is a cathode region of the diode 170a. The second contact region 150b is an anode region of the diode 170a. The first contact region 150a and the third contact region 150c are located on opposite sides of the second contact region 150b. The first contact region 150a is coupled with the phase conductor BP. The second contact region 150b is coupled with the grounding line. The third contact region 150c is coupled with the line SP. The line SP couples the breakdown element 110e and the impedance control circuit 120. In an SOI region where the diode 170c of the breakdown element 110f is located, the first contact region 150d, the second contact region 150e, and the third contact region 150f are located. The first contact region 150d is a cathode region of the diode 170c. The second contact region 150e is an anode region of the diode 170c. The first contact region 150d and the third contact region 150f are located on opposite sides of the second contact region 150e. The first contact region 150d is coupled with the phase conductor BM. The second contact region 150e is coupled with the grounding line. The third contact region 150f is coupled with the line SM. The line SM couples the breakdown element 110f and the impedance control circuit 120. Thus, the semiconductor device 100b restricts a surge current from flowing to the internal circuit and the impedance control circuit 120 in a manner similar to the semiconductor device 100. Therefore, the impedance control circuit 120 is restricted from being damaged by the surge current.

As described above, the breakdown element 110e includes the diodes 170a and 170b that are symmetrically-coupled in series, and the breakdown element 110f includes the diodes 170c and 170d that are symmetrically-coupled in series. Thus, the breakdown elements 110e and 110f can correspond to a case where the signal of each of the phase conductors BP and BM has both of a positive voltage and a negative voltage. In a case where the input signal of each of the phase conductors BP and BM has only one of a positive voltage and a negative voltage, each of the breakdown elements 110e and 110f can introduce a surge current to the grounding line or the power supply line by using only one diode in a manner similar to the semiconductor device 100a.

(Thirteenth Embodiment)

Figure 28:
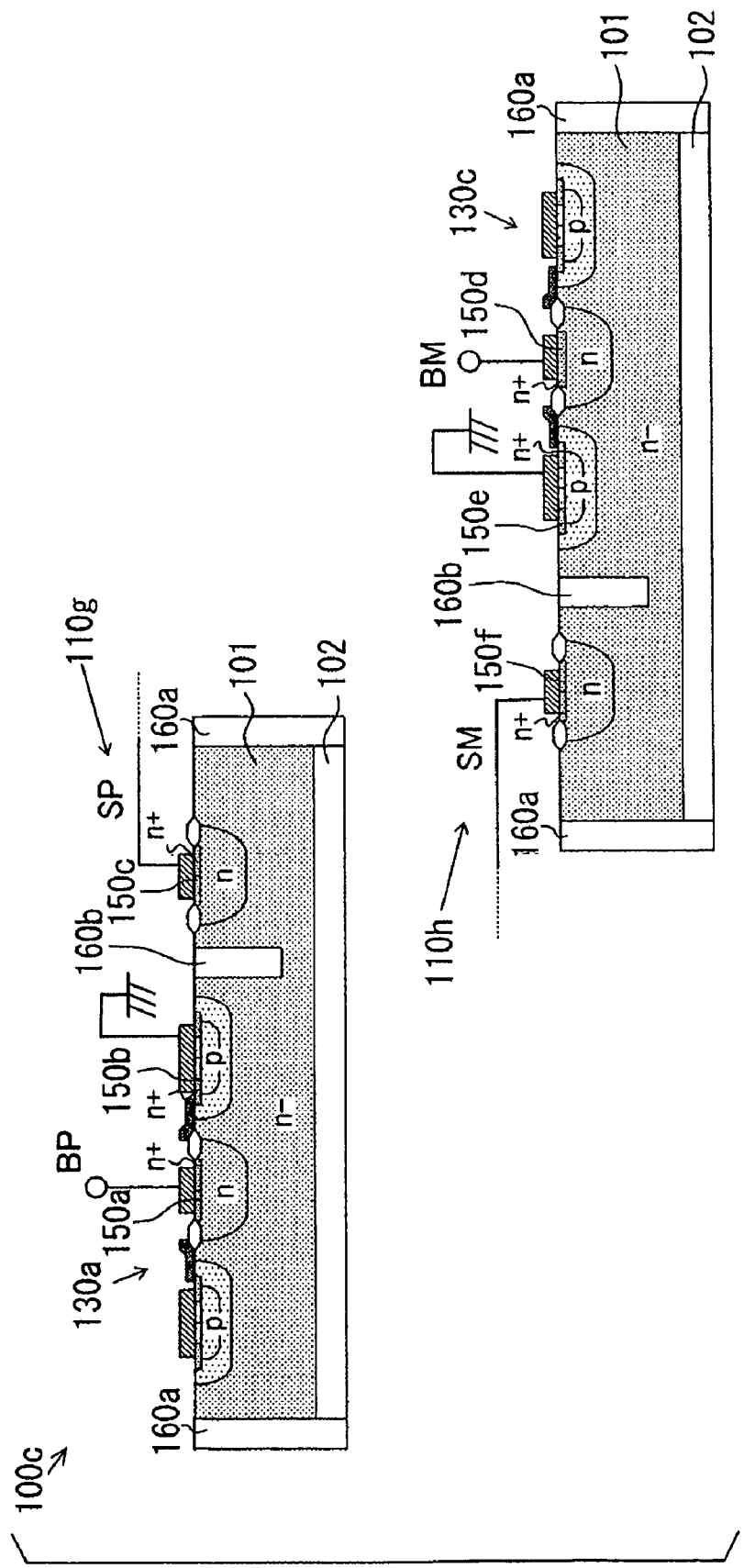
FIG. 28 is a cross-sectional diagram illustrating a semiconductor device according to a thirteenth embodiment of the present invention.

A semiconductor device 100c according to a thirteenth embodiment of the present invention will be described with reference to FIG. 28.

The semiconductor device 100c includes breakdown elements 110g and 110h and the impedance control circuit 120. The breakdown element 110g includes the horizontal MOSFET 130a. The breakdown element 110h includes the horizontal MOSFET 130c. In the breakdown element 110g, an isolation trench 160b is provided between the second contact region 150b and the third contact region 150c so as to cut off a shortest current pathway between the second contact region 150b and the third contact region 150c. Also in the breakdown element 110h, an isolation trench 160b is provided between the second contact region 150e and the third contact region 150f so as to cut off a shortest current pathway between the second contact region 150e and the third contact region 150f. Each of the isolation trenches 160b does not reach the buried oxide layer 102. The semiconductor device 100c can restrict the flow of a surge current into the impedance control circuit 120 and the internal circuit more effectively than the semiconductor device 100a due to the isolation trenches 160b.

(Fourteenth Embodiment)

Figure 29:
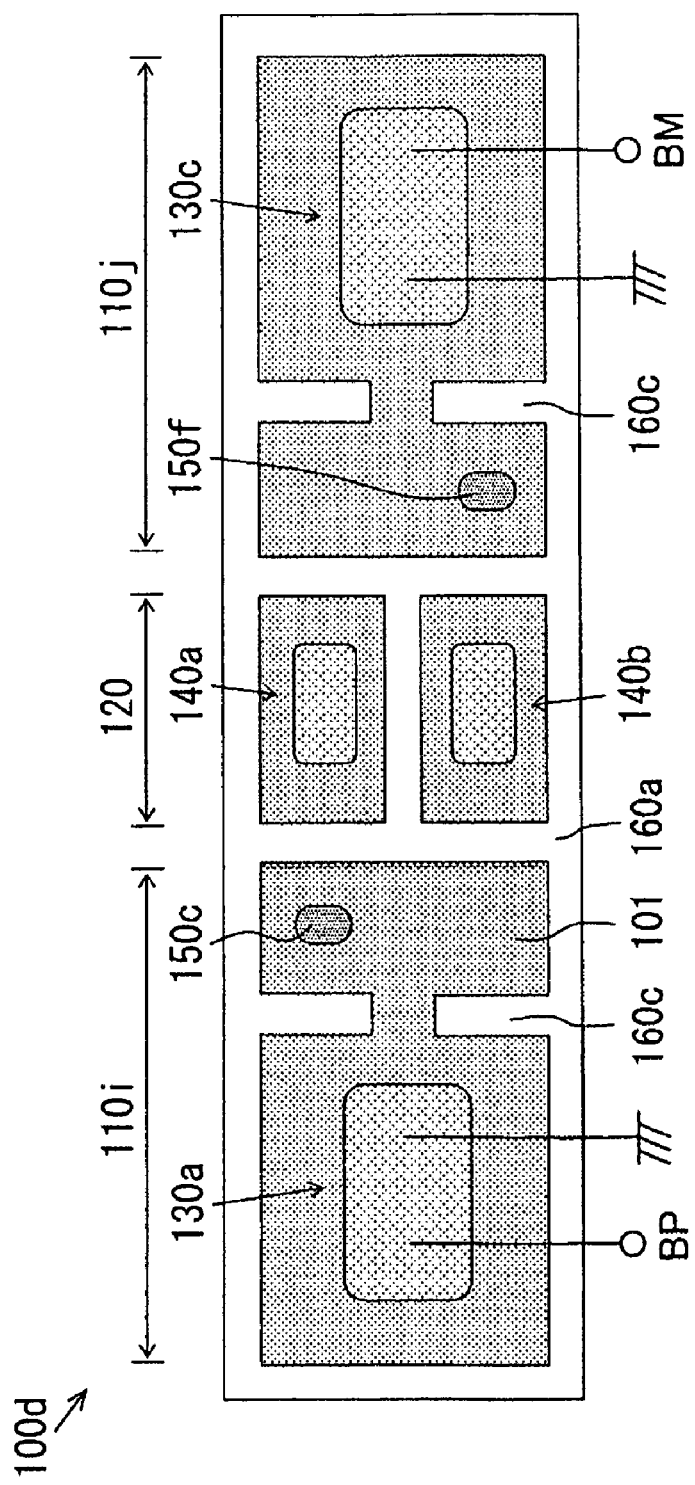
FIG. 29 is a top view illustrating a semiconductor device according to a fourteenth embodiment of the present invention.

A semiconductor device 100d according to a fourteenth embodiment of the present invention will be described with reference to FIG. 29.

The semiconductor device 100d includes breakdown elements 110i and 110j and the impedance control circuit 120. The breakdown element 110i includes the horizontal MOSFET 130a. The breakdown element 110j includes the horizontal MOSFET 130c. In the breakdown element 110i, isolation trenches 160c are provided between the second contact region 150b and the third contact region 150c so as to cut off the shortest current pathway between the second contact region 150b and the third contact region 150c. In the breakdown element 110i, isolation trenches 160c are provided between the second contact region 150e and the third contact region 150f so as to cut off the shortest current pathway between the second contact region 150e and the third contact region 150f. Each of the isolation trenches 160c extends from the isolation trench 160c toward an inside of the semiconductor substrate 101.

The semiconductor device 100d can restrict the flow of a surge current into the impedance control circuit 120 and the internal circuit more effectively than the semiconductor device 100a due to the isolation trenches 160c. The isolation trenches 160c can be provided at a time when the isolation trench 160a is provided. Thus, a production cost of the semiconductor device 100d can be reduced. An impedance between the first contact region 150a and the third contact region 150c and an impedance between the first contact region 150d and the third contact region 150f can be controlled with a clearance of the isolation trenches 160c.

(Fifteenth Embodiment)

Figure 30:
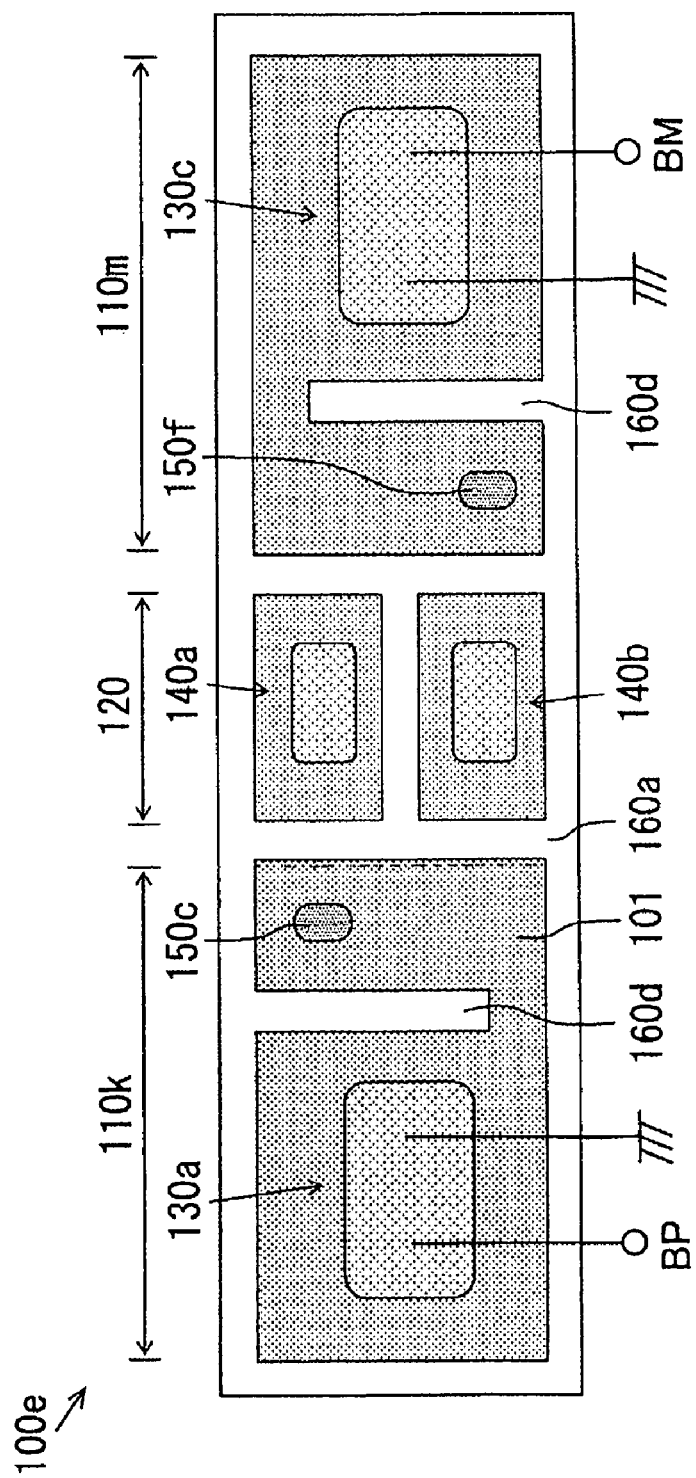
FIG. 30 is a top view illustrating a semiconductor device according to a fifteenth embodiment of the present invention.

A semiconductor device 100e according to a fifteenth embodiment of the present invention will be described with reference to FIG. 30.

The semiconductor device 100e includes breakdown elements 110k and 110m and the impedance control circuit 120. The breakdown element 110k includes the horizontal MOSFET 130a. The breakdown element 110m includes the horizontal MOSFET 130c. In the breakdown element 110k, an isolation trench 160d is provided between the second contact region 150b and the third contact region 150c so as to cut off the shortest current pathway between the second contact region 150b and the third contact region 150c. In the breakdown element 110m, an isolation trench 160d is provided between the second contact region 150e and the third contact region 150f so as to cut off the shortest current pathway between the second contact region 150e and the third contact region 150f. Each of the isolation trenches 160d extends from the isolation trench 160c toward an inside of the semiconductor substrate 101.

The semiconductor device 100e can restrict the flow of a surge current into the impedance control circuit 120 and the internal circuit more effectively than the semiconductor device 100a due to the isolation trenches 160d. The isolation trenches 160d can be provided at a time when the isolation trench 160a is provided. Thus, a production cost of the semiconductor device 100e can be reduced. An impedance between the first contact region 150a and the third contact region 150c and an impedance between the first contact region 150d and the third contact region 150f can be controlled with a clearance of the isolation trenches 160d.

(Sixteenth Embodiment)

Figure 31:
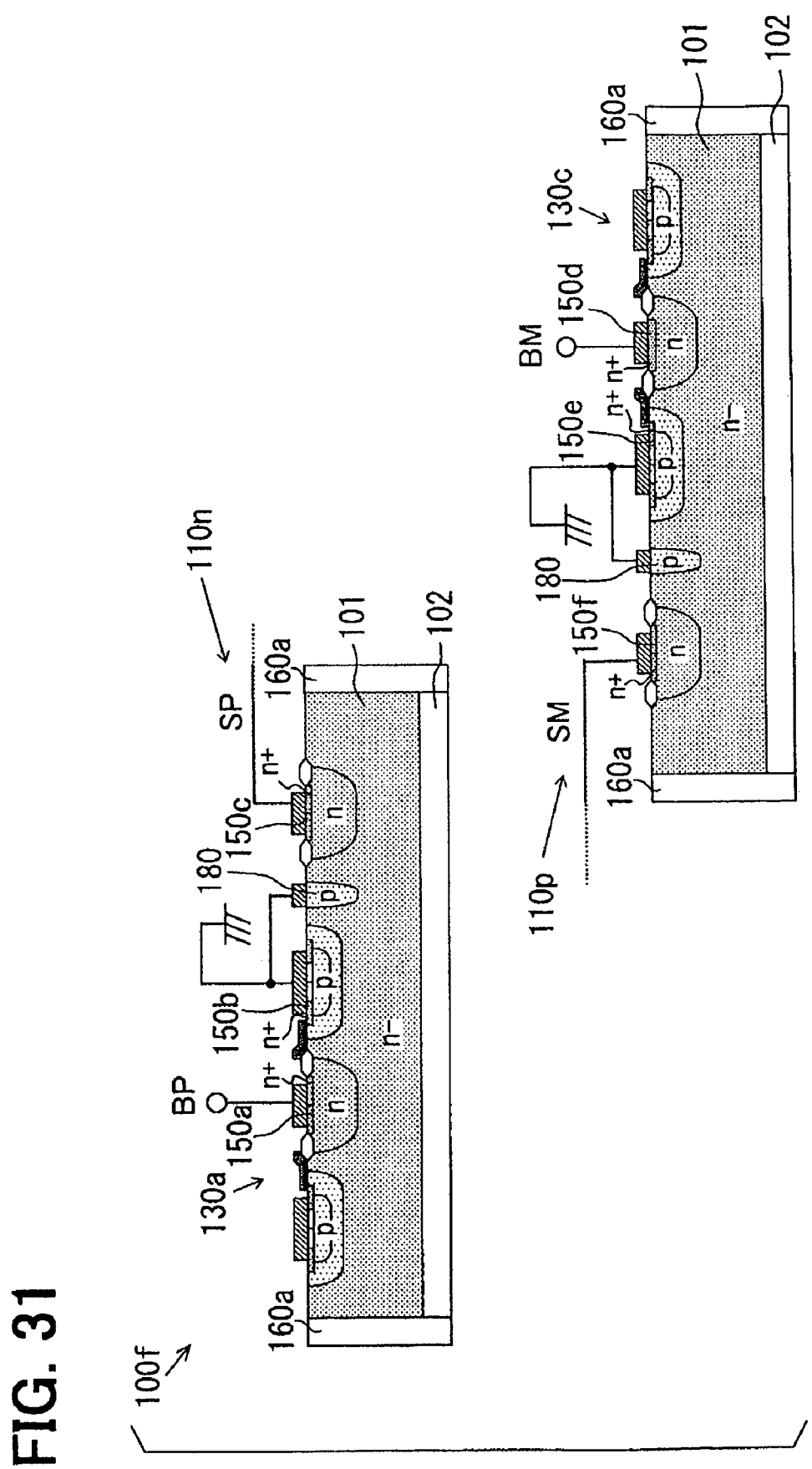
FIG. 31 is a cross-sectional diagram illustrating a semiconductor device according to a sixteenth embodiment of the present invention.
Figure 32:
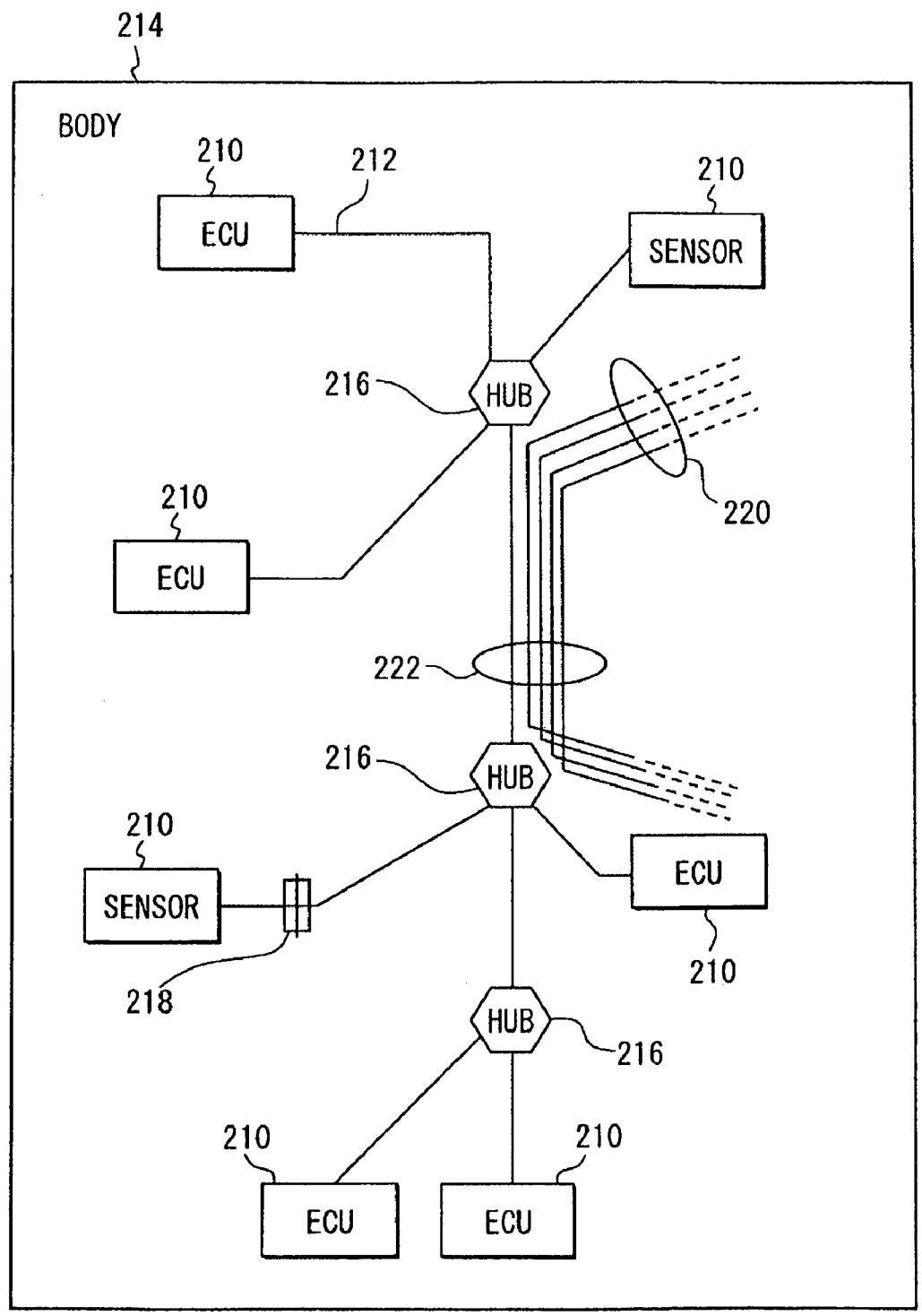
FIG. 32 is a block diagram illustrating a differential communication network according an example of the prior art.

A semiconductor device 100f according to a sixteenth embodiment of the present invention will be described with reference to FIG. 31.

The semiconductor device 100f includes breakdown elements 110n and 110p and the impedance control circuit 120. The breakdown element 110n includes the horizontal MOSFET 130a. The breakdown element 110p includes the horizontal MOSFET 130c. In the breakdown element 110n, a diffusion layer 180 is disposed between the second contact region 150b and the third contact region 150c so as to cut off the shortest current pathway between the second contact region 150b and the third contact region 150c. In the breakdown element 110p, a diffusion layer 180 is disposed between the second contact region 150e and the third contact region 150f so as to cut off the shortest current pathway between the second contact region 150e and the third contact region 150f. Each of the diffusion layers 180 has a conductivity type opposite to the semiconductor substrate 101.

The semiconductor device 100d can restrict a flow of a surge current into the impedance control circuit 120 and the internal circuit more effectively than the semiconductor device 100a due to the diffusion layers 180.

(Other Embodiments)

Although the present invention has been fully described in connection with the exemplary embodiments thereof with reference to the accompanying drawings, it is to be noted that various changes and modifications will become apparent to those skilled in the art.

For example, in the receiving devices according to the first to ninth embodiments, the input impedance may not be matched with the characteristic impedance of the communication line as long as a ringing of a signal can be restricted. The input impedance may be increased. In the receiving device 15 illustrated in FIG. 4A and the receiving device 15b illustrated in FIG. 13, the resistance elements 24a and 24b may be removed if the threshold voltage is not required to be controlled on a back-gate side. The on-resistance of the MOSFET may be an impedance element. In the receiving device 15d, the resistance elements 37a and 37b may be removed and the input impedance may be changed by using the on-resistance of the diodes 36a and 36b. In the receiving device 15e, the resistance elements 40 may be removed and the input impedance may be changed by using the on-resistance of the zener diodes 39a and 39b. A P channel MOSFET may be provided instead of the above-described N channel MOSFET. A PNP transistor may be provided instead of the above-described NPN transistor.

When the physical value detected by the detecting part is the electric current, a resistance element for detecting electric current may be inserted in the communication line. When the physical value detected by the detecting part is the electric power, a product of the voltage and the electric current may be calculated. Threshold value of each of the voltage, the electric current and the electric power may be set. In the present case, the impedance control circuit may be operated based on a combination of result, for example, an AND condition or an OR condition.

In the semiconductor devices 100c-100f illustrated in FIG. 28-FIG. 31, each of the breakdown elements includes one horizontal MOSFET. Alternatively, the breakdown elements may also include two horizontal MOSFETs that are symmetrically coupled in series. Alternatively, each of the breakdown elements may include at least one diode. Also in the present case, effects similar to the effects of the semiconductor devices 100c-100f can be obtained by providing at least one of the isolation trenches 160b-160d and the diffusion layers 180.

In each of the semiconductor devices 100-100f, the semiconductor substrate 101 having the SOI structure is used. Alternatively, the semiconductor substrate 101 may be made of a bulk silicon single-crystal substrate and each of elements may be insulated from each other by a PN junction.

An application of the above-described receiving devices and the semiconductor devices is not limited to the in-vehicle LAN. The above-described receiving devices and the above-described semiconductor devices may be used for a communication that uses a wired communication line.

What is claimed is:

1. A receiving device to be coupled with a communication line, comprising:

a receiving circuit configured to receive a signal transmitted through the communication line; and an impedance control circuit coupled with the receiving circuit and having a detecting part, wherein:

the detecting part is configured to detect a physical value of the signal;

the physical value includes at least one of a voltage, an electric current, and an electric power;

the impedance control circuit is configured to change an input impedance based on the detected value so that a ringing of the signal is reduced;

the impedance control circuit includes a semiconductor switching element;

the semiconductor switching element includes a metal-oxide-semiconductor field-effect transistor;

the impedance control circuit further includes a gate bias circuit, a first impedance element for controlling a threshold value, and a second impedance element for controlling the input impedance;

the metal-oxide-semiconductor field-effect transistor is coupled in parallel with the receiving circuit;

a back-gate of the metal-oxide-semiconductor field-effect transistor is coupled to a source side of the metal-oxide-semiconductor field-effect transistor through the first impedance element;

a gate of the metal-oxide-semiconductor field-effect transistor is coupled to a drain side of the metal-oxide-semiconductor field-effect transistor through the gate bias circuit; and the second impedance element is coupled to one of the source side and the drain side of the metal-oxide-semiconductor field-effect transistor.

* * * * *